United States Patent
Yamazaki et al.

(10) Patent No.: US 8,492,806 B2
(45) Date of Patent: *Jul. 23, 2013

(54) NON-LINEAR ELEMENT, DISPLAY DEVICE INCLUDING NON-LINEAR ELEMENT, AND ELECTRONIC DEVICE INCLUDING DISPLAY DEVICE

(75) Inventors: Shunpei Yamazaki, Tokyo (JP); Daisuke Kawae, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 347 days.

This patent is subject to a terminal disclaimer.

(21) Appl. No.: 12/912,353

(22) Filed: Oct. 26, 2010

(65) Prior Publication Data
US 2011/0101338 A1    May 5, 2011

(30) Foreign Application Priority Data
Oct. 30, 2009  (JP) .................................. 2009-251503

(51) Int. Cl.
*H01L 31/062*  (2012.01)
*H01L 31/113*  (2006.01)

(52) U.S. Cl.
USPC ........... 257/292; 257/212; 257/233; 257/288; 257/293; 257/910; 257/E29.117; 257/E29.122

(58) Field of Classification Search
USPC ................ 257/212, 233, 288, 292, 293, 910, 257/E29.117, E29.122
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |

(Continued)

FOREIGN PATENT DOCUMENTS

| | | |
|---|---|---|
| EP | 1 737 044 A1 | 12/2006 |
| EP | 2 073 255 A2 | 6/2009 |

(Continued)

OTHER PUBLICATIONS

International Search Report, PCT Application No. PCT/JP2010/068414, dated Jan. 25, 2011, 3 pages.

(Continued)

*Primary Examiner* — Michelle Mandala
(74) *Attorney, Agent, or Firm* — Fish & Richardson P.C.

(57) ABSTRACT

A non-linear element, such as a diode, in which an oxide semiconductor is used and a rectification property is favorable is provided. In a thin film transistor including an oxide semiconductor in which the hydrogen concentration is less than or equal to $5 \times 10^{19}/cm^3$, the work function $\phi ms$ of a source electrode in contact with the oxide semiconductor, the work function $\phi md$ of a drain electrode in contact with the oxide semiconductor, and electron affinity $\chi$ of the oxide semiconductor satisfy $\phi ms \leq \chi < \phi md$. By electrically connecting a gate electrode and the drain electrode of the thin film transistor, a non-linear element with a more favorable rectification property can be achieved.

35 Claims, 16 Drawing Sheets

U.S. PATENT DOCUMENTS

| | | | |
|---|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,566,922 B2 | 7/2009 | Deleonibus |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,786,482 B2 | 8/2010 | Yamazaki et al. |
| 7,791,072 B2 | 9/2010 | Kumomi et al. |
| 7,791,074 B2 | 9/2010 | Iwasaki |
| 7,863,611 B2 | 1/2011 | Abe et al. |
| 7,935,582 B2 | 5/2011 | Iwasaki |
| 7,956,361 B2 | 6/2011 | Iwasaki |
| 7,989,815 B2 | 8/2011 | Yamazaki et al. |
| 8,154,024 B2 | 4/2012 | Iwasaki |
| 8,203,146 B2 | 6/2012 | Abe et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0086933 A1 | 4/2006 | Iechi et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0214571 A1 | 9/2006 | Yamamoto et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0159885 A1 | 6/2009 | Yamazaki et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0276689 A1 | 11/2010 | Iwasaki |
| 2010/0279462 A1 | 11/2010 | Iwasaki |
| 2011/0050733 A1 | 3/2011 | Yano et al. |
| 2011/0101336 A1 | 5/2011 | Yamazaki |
| 2011/0101337 A1 | 5/2011 | Yamazaki |
| 2011/0101355 A1 | 5/2011 | Yamazaki |
| 2011/0101356 A1 | 5/2011 | Yamazaki |
| 2011/0127526 A1 | 6/2011 | Kawae et al. |

FOREIGN PATENT DOCUMENTS

| | | |
|---|---|---|
| EP | 2 226 847 A2 | 9/2010 |
| EP | 2 339 639 A2 | 6/2011 |
| JP | 55-006856 A | 1/1980 |
| JP | 60-182762 A | 9/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 60-182762 A | 9/1995 |
| JP | 07-297406 A | 11/1995 |
| JP | 08-264794 A | 10/1996 |
| JP | 11-505377 A | 5/1999 |
| JP | 2000-044236 A | 2/2000 |
| JP | 2000-133819 A | 5/2000 |
| JP | 2000-150900 A | 5/2000 |
| JP | 2001-244482 A | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-110110 A | 4/2003 |
| JP | 2004-103957 A | 4/2004 |
| JP | 2004-273614 A | 9/2004 |
| JP | 2004-273732 A | 9/2004 |
| JP | 2005-294571 A | 10/2005 |
| JP | 2006-165527 A | 6/2006 |
| JP | 2006-165528 A | 6/2006 |
| JP | 2006-165529 A | 6/2006 |
| JP | 2006-165532 A | 6/2006 |
| JP | 2007-103918 A | 4/2007 |
| JP | 2009-170900 A | 7/2009 |
| WO | 2004/114391 A1 | 12/2004 |
| WO | 2006/051993 A2 | 5/2006 |
| WO | 2007/029844 A1 | 3/2007 |
| WO | 2008/096768 A1 | 8/2008 |

OTHER PUBLICATIONS

Written Opinion, PCT Application No. PCT/JP2010/068414, dated Jan. 25, 2011, 4 pages.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, Ret al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214TH ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In203-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13TH International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In-Ga-Zn-Oxide TFTS With a Novel Passivation Layers," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. Amoled Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGS AMOLED Driven by the Threshold Voltage Controlled Amorphous GiZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW'08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

NON-LINEAR ELEMENT, DISPLAY DEVICE INCLUDING NON-LINEAR ELEMENT, AND ELECTRONIC DEVICE INCLUDING DISPLAY DEVICE

TECHNICAL FIELD

An embodiment of the present invention relates to a non-linear element (e.g., a diode) including an oxide semiconductor and a semiconductor device such as a display device including the non-linear element. Further, an embodiment of the present invention relates to an electronic device including the semiconductor device.

BACKGROUND ART

Among semiconductor devices, diodes are required to have high withstand voltage, small reverse saturation current, and the like. In order to meet such a requirement, a diode in which silicon carbide (SiC) is used has been researched. Silicon carbide used as a semiconductor material has a width of a forbidden band of greater than or equal to 3 eV, excellent controllability of electric conductivity at high temperature, and a dielectric breakdown electric field that is about an order of magnitude higher than that of silicon. Therefore, silicon carbide is expected to be applied to a diode in which reverse saturation current is small and withstand voltage is high. For example, a Schottky barrier diode in which silicon carbide is used and reverse leakage current is reduced is known (Patent Document 1).

However, in the case of using silicon carbide, it is difficult to obtain crystals with good quality, and further, there is a problem that a process temperature for manufacturing a device is high. For example, an ion implantation method is used to form an impurity region in silicon carbide; in that case, heat treatment at greater than or equal to 1500° C. is necessary in order to activate a dopant or repair crystal defects caused by ion implantation.

In addition, since carbon is contained as a component in silicon carbide, an insulating film with good quality cannot be formed by thermal oxidation. Furthermore, silicon carbide is chemically very stable and is not easily etched by normal wet etching.

REFERENCE

[Patent Document]
[Patent Document 1] Japanese Published Patent Application No. 2000-133819

DISCLOSURE OF INVENTION

As described above, although a diode in which silicon carbide is used is expected to have high withstand voltage and small reverse saturation current, there are many problems in manufacturing and achieving such a diode.

In view of the above, it is an object of an embodiment of the present invention to provide a non-linear element such as a diode with small reverse saturation current. In addition, it is an object to manufacture a non-linear element such as a diode with small reverse saturation current at low process temperature (e.g., less than or equal to 800° C.).

An embodiment of the present invention includes a first electrode formed over a substrate, an oxide semiconductor layer formed on and in contact with the first electrode in which the hydrogen concentration measured by secondary ion mass spectrometry is less than or equal to $5\times10^{19}/cm^3$, and a second electrode formed on and in contact with the oxide semiconductor layer. A work function $\phi ma$ of the first electrode, electron affinity $\chi$ of the oxide semiconductor layer, and a work function $\phi mc$ of the second electrode satisfy $\phi mc \leqq \chi < \phi ma$.

Another embodiment of the present invention includes a source electrode, a drain electrode, a gate electrode, and an oxide semiconductor layer in which a channel is formed. The source electrode and the drain electrode are in contact with the oxide semiconductor layer so as to sandwich a channel formation region of the oxide semiconductor layer. The gate electrode overlaps with the channel formation region of the oxide semiconductor layer with an insulating film interposed therebetween and is electrically connected to the drain electrode. A work function $\phi ms$ of the source electrode, a work function $\phi md$ of the drain electrode, and electron affinity $\chi$ of the oxide semiconductor layer satisfy $\phi ms \leqq \chi < \phi md$.

Another embodiment of the present invention includes a first electrode formed over a substrate, an oxide semiconductor layer formed on and in contact with the first electrode in which the hydrogen concentration measured by secondary ion mass spectrometry is less than or equal to $5\times10^{19}/cm^3$, a second electrode formed on and in contact with the oxide semiconductor layer, a gate insulating film covering the first electrode, the oxide semiconductor layer, and the second electrode, and a plurality of third electrodes formed in contact with the gate insulating film, which face each other with the first electrode, the oxide semiconductor layer, and the second electrode interposed therebetween. The plurality of third electrodes is connected to the first electrode. A work function $\phi md$ of the first electrode, electron affinity $\chi$ of the oxide semiconductor layer, and a work function $\phi ms$ of the second electrode satisfy $\phi ms \leqq \chi < \phi md$.

Specifically, an oxide semiconductor layer in which hydrogen or an OH group is removed so that the hydrogen concentration is set to less than or equal to $5\times10^{19}/cm^3$, preferably less than or equal to $5\times10^{18}/cm^3$, more preferably less than or equal to $5\times10^{17}/cm^3$ and the carrier concentration is set to less than or equal to $5\times10^{14}/cm^3$, preferably less than or equal to $5\times10^{12}/cm^3$ is used.

The energy gap of the oxide semiconductor is greater than or equal to 2 eV, preferably greater than or equal to 2.5 eV, more preferably greater than or equal to 3 eV. An impurity such as hydrogen, which forms a donor, is reduced as much as possible. The carrier concentration is set to less than or equal to $1\times10^{14}/cm^3$, preferably less than or equal to $1\times10^{12}/cm^3$.

For example, a material of the first electrode can be tungsten (W), molybdenum (Mo), chromium (Cr), iron (Fe), or indium tin oxide (ITO). In addition, a material of the second electrode can be titanium (Ti), yttrium (Y), aluminum (Al), magnesium (Mg), silver (Ag), or zirconium (Zr).

In addition, as the materials of the first electrode and the second electrode, copper, tantalum, manganese, beryllium, thorium, or the like can be used, besides the above materials.

In addition, a difference $\Delta\phi$ between the work function $\phi ma$ and the electron affinity $\chi$ or a difference $\Delta\phi$ between the work function $\phi md$ and the electron affinity $\chi$ is set to greater than or equal to 0.1 eV, preferably greater than or equal to 0.2 eV, so that a favorable rectification property can be obtained.

Note that in this specification, the impurity concentration is measured by secondary ion mass spectrometry (hereinafter also referred to as SIMS). However, there is no particular limitation when descriptions of other measurement methods are made.

An embodiment of the present invention provides a non-linear element such as a diode which can be miniaturized and includes a field effect transistor, for example, a thin film transistor that can be manufactured at low process temperature, has large on current, and small off current.

It is possible to obtain a non-linear element such as a diode which can be miniaturized, has large forward current, and very small reverse current. Accordingly, a non-linear element such as diode which is resistant to a breakdown (i.e., has high withstand voltage) can be manufactured.

BEST MODE FOR CARRYING OUT THE INVENTION

Figure 1A:
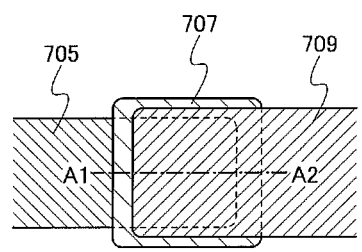
FIGS. 1A and 1B are a top view and a cross-sectional view illustrating a diode according to an embodiment of the present invention.

Embodiments of the present invention will be described in detail with reference to the drawings. Note that the present invention is not limited to the description below, and it will be easily understood by those skilled in the art that modes and details thereof can be changed in various ways without departing from the spirit and the scope of the present invention. Therefore, the present invention should not be construed as being limited to the description of the embodiments. Note that in structures of the present invention described below, like portions or portions having similar functions are denoted by the same reference numerals in different drawings, and description thereof is not repeated.

Note that in each drawing described in this specification, the size of each component or the thickness of each layer or an area is exaggerated in some cases for clarification. Therefore, embodiments of the present invention are not limited to such scales.

Note that terms such as "first", "second", and "third" in this specification are used in order to avoid confusion among components, and the terms do not limit the components numerically. Therefore, for example, description can be made even when "first" is replaced with "second" or "third", as appropriate.

Note that a voltage refers to a difference between electric potentials of two points, and an electric potential refers to electrostatic energy (electrical potential energy) of a unit charge at a given point in an electrostatic field. Note that in general, a difference between an electric potential of one point and a reference electric potential is merely called an electric potential or a voltage, and an electric potential and a voltage are used as synonymous words in many cases. Thus, in this specification, an electric potential may be rephrased as a voltage and a voltage may be rephrased as an electric potential unless otherwise specified.

(Embodiment 1)

In this embodiment, a diode in which a difference between work functions is utilized will be described as an embodiment of a non-linear element including an oxide semiconductor with reference to FIGS. 1A and 1B.

In general, a diode has a structure in which a p-type semiconductor and an n-type semiconductor are joined together. When an electric potential of the p-type semiconductor is higher than an electric potential of the n-type semiconductor, the diode is in a state in which current flows, that is, a conduction state. On the other hand, when the electric potential of the p-type semiconductor is lower than the electric potential of the n-type semiconductor, the diode is in a state in which current scarcely flows, that is, a non-conduction state (insulating state).

Such a characteristic of the diode is called a rectification property. A direction in which the diode is in a conduction state is a forward direction, and a direction in which the diode is in a non-conduction state is a reverse direction. Voltage and current in a forward direction are forward voltage and forward current, and voltage and current in a reverse direction are reverse voltage and reverse current. In addition, the p-type semiconductor side is an anode, and the n-type semiconductor side is a cathode.

In order to form the p-type semiconductor and the n-type semiconductor over one substrate, the p-type semiconductor and n-type semiconductor need separate deposition apparatuses and separate processing steps such as photolithography steps, which complicates a manufacturing process of a semiconductor device, reduces the yield, and increases the manufacturing cost. In this embodiment, a structure to achieve a diode with the use of a highly purified oxide semiconductor (including an i-type or substantially i-type oxide semiconductor) as a semiconductor is described.

Note that a highly purified oxide semiconductor layer includes an oxide semiconductor layer in which hydrogen or an OH group is removed so that the hydrogen concentration is set to less than or equal to $5\times10^{19}/cm^3$, preferably less than or equal to $5\times10^{18}/cm^3$, more preferably less than or equal to $5\times10^{17}/cm^3$ and the carrier concentration is set to less than or equal to $5\times10^{14}/cm^3$, preferably less than or equal to $5\times10^{12}/cm^3$.

Figure 1B:
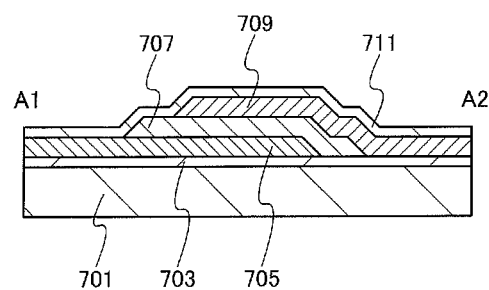

FIG. 1A is a top view of a diode which includes an oxide semiconductor described in this embodiment, and FIG. 1B is a cross-sectional view along dashed-and-dotted line A1-A2 in FIG. 1A. An insulating film 703 is formed as a base layer over a substrate 701, a conductive layer 705 serving as an anode is formed over the insulating film 703, a highly purified oxide semiconductor layer 707 is formed over the conductive layer 705, a conductive layer 709 serving as a cathode is formed over the oxide semiconductor layer 707, and an insulating film 711 is formed over the conductive layer 709. A work function (φma) of a conductive material used for the conductive layer 705 which is in contact with the oxide semiconductor layer 707 and serves as an anode, electron affinity (χ) of the oxide semiconductor layer 707, and a work function (φmc) of a conductive material used for the conductive layer 709 which is in contact with the oxide semiconductor layer 707 and serves as a cathode satisfy Formula 1.

$$\phi mc \leq \chi < \phi ma \qquad \text{Formula 1}$$

For example, when the electron affinity (χ) of the oxide semiconductor is 4.3 eV, tungsten (W), molybdenum (Mo), chromium (Cr), iron (Fe), indium tin oxide (ITO), or the like can be given as an example of a conductive material with a work function that is higher than the electron affinity of the oxide semiconductor. In addition, as an example of a conductive material with a work function that is less than or equal to the electron affinity of the oxide semiconductor, titanium (Ti), yttrium (Y), aluminum (Al), magnesium (Mg), silver (Ag), zirconium (Zr), or the like can be given.

When Formula 1 is satisfied with the use of conductive materials each with a work function which has a value different from that of the electron affinity of the oxide semiconductor, the oxide semiconductor can be used for a diode.

Figure 2A:
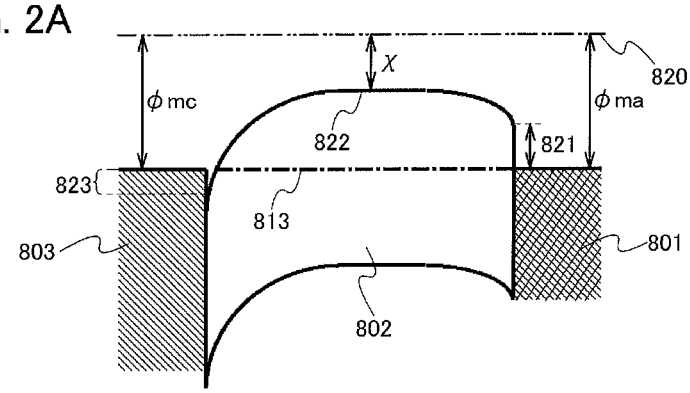
FIGS. 2A to 2C are band diagrams of a diode according to an embodiment of the present invention.
Figure 2B:
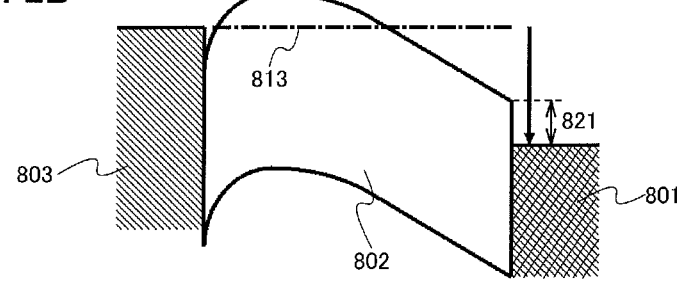
Figure 2C:
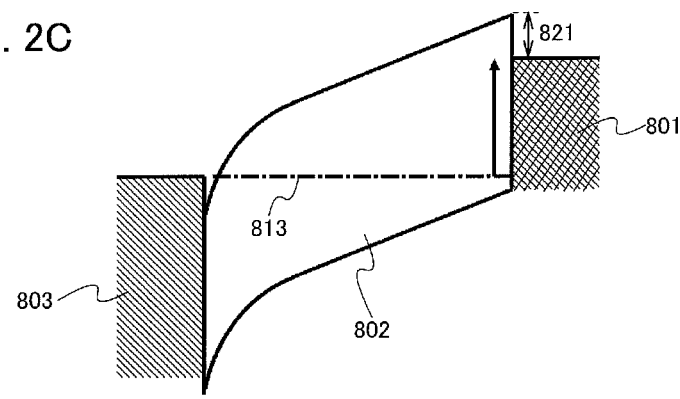

A rectification property of the diode including the oxide semiconductor described in this embodiment is described using band diagrams in FIGS. 2A to 2C. FIGS. 2A to 2C are band diagrams each illustrating a state in which an anode 801 and a cathode 803 are joined to a highly purified oxide semiconductor 802 (including an i-type or substantially i-type oxide semiconductor).

Note that a highly purified oxide semiconductor includes an oxide semiconductor in which hydrogen or an OH group is removed so that the hydrogen concentration is set to less than or equal to $5 \times 10^{19}/cm^3$, preferably less than or equal to $5 \times 10^{18}/cm^3$, more preferably less than or equal to $5 \times 10^{17}/cm^3$ and the carrier concentration is set to less than or equal to $5 \times 10^{14}/cm^3$, preferably less than or equal to $5 \times 10^{12}/cm^3$.

FIG. 2A is a band diagram when the anode 801 and the cathode 803 have the same electric potential (a thermal equilibrium state). A Fermi level 813 is a Fermi level of the cathode 803, and Fermi levels of the anode 801, the cathode 803, and the oxide semiconductor 802 are equal to each other. A level 820 is a vacuum level.

An energy barrier 821 is a difference in energy (φma−χ) between a work function (φma) of the anode 801 and electron affinity (χ) of the oxide semiconductor 802. In addition, an energy barrier 823 is a difference in energy (φmc−χ) between a work function (φmc) of the cathode 803 and electron affinity (χ) of the oxide semiconductor 802.

Since the work function (φma) of the anode 801 is higher than the electron affinity (χ) of the oxide semiconductor 802, the energy barrier 821 has a positive value. Therefore, electrons in the anode 801 are blocked by the energy barrier 821 and can hardly move to a conduction band 822 of the oxide semiconductor 802.

On the other hand, since the work function (φmc) of the cathode 803 is less than or equal to the electron affinity (χ) of the oxide semiconductor 802, the energy barrier 823 has a negative value. Therefore, electrons in the cathode 803 can easily move to the conduction band 822 of the oxide semiconductor 802.

When the anode 801 and the cathode 803 have the same electric potential (a thermal equilibrium state), a conduction band edge which is upwardly projected becomes a barrier against electron transfer, and thus, electrons cannot move to the anode 801. That is, current does not flow between the anode 801 and the cathode 803.

FIG. 2B is a band diagram illustrating a state in which positive voltage (forward voltage) is applied to the anode 801. The application of positive voltage to the anode 801 moves down the Fermi level of the anode 801, and electrons moved to the conduction band 822 from the cathode 803 can easily move to the anode 801. Therefore, current (forward current) flows between the anode 801 and the cathode 803.

FIG. 2C is a band diagram illustrating a state in which negative voltage (reverse voltage) is applied to the anode 801. The application of negative voltage to the anode 801 moves up the Fermi level of the anode 801, and electrons moved to the conduction band 822 from the cathode 803 cannot move to the anode 801. In addition, the energy barrier 821 is not changed, and thus, electrons in the anode 801 can hardly move to the conduction band 822 of the oxide semiconductor 802. However, since there are a very small number of electrons which move to the conduction band 822 over the energy barrier 821 with a certain probability, very small current (reverse current) flows between the cathode 803 and the anode 801.

When the work function (φma) of a conductive material used for the anode, the electron affinity (χ) of the oxide semiconductor, and the work function (φmc) of a conductive material used for the cathode satisfy Formula 1, a rectification property can be achieved.

Next, an energy difference between a work function of the conductive layer serving as the anode and electron affinity of the oxide semiconductor layer for achieving a rectification property was examined by device simulation. A result of the examination is described. For the device simulation, software ATLAS which was made by Silvaco Data Systems Inc. was used. The work function (φmc) of the conductive layer serving as the cathode was 4.3 eV, the electron affinity (χ) of the oxide semiconductor layer was 4.3 eV, a distance between the anode and the cathode (the thickness of the oxide semiconductor layer) was 100 nm, and a contact area of the anode, the cathode, and the oxide semiconductor layer was 1 μm²; simulation was performed under this condition.

Figure 3:
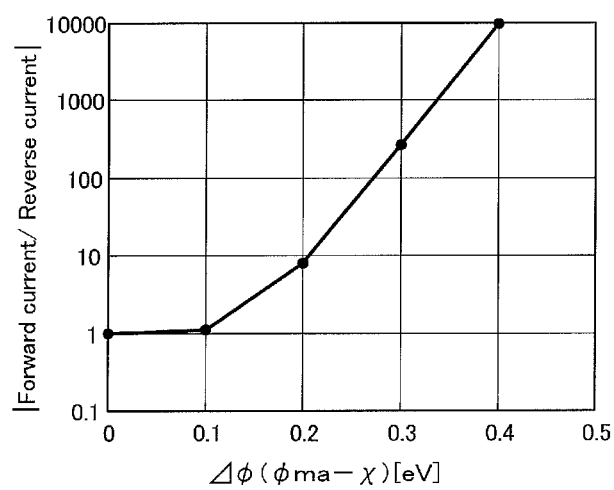
FIG. 3 is a graph showing a simulation result of a diode according to an embodiment of the present invention.

FIG. 3 shows the simulation result. The horizontal axis of FIG. 3 shows a difference (Δφ) between the work function (φma) of the conductive layer serving as the anode and the electron affinity (χ) of the oxide semiconductor layer. The vertical axis shows an absolute value of a value obtained by dividing forward current when forward voltage is 1 V by reverse current when reverse voltage is 1 V on a logarithmic scale. The larger the value is, the more favorable the rectification property becomes. It is found from FIG. 3 that a favorable rectification property can be obtained when Δφ is greater than or equal to 0.1 eV, preferably greater than or equal to 0.2 eV.

Since a band gap of the oxide semiconductor is greater than or equal to 3 eV which is much wider than that of silicon, germanium, or the like, current in applying reverse voltage is expected to be reduced.

In addition, with a structure in which an oxide semiconductor layer is sandwiched between conductive materials with different work functions, a diode having an excellent rectification property can be manufactured with high productivity without an increase in manufacturing steps.

(Embodiment 2)

In this embodiment, as one mode of a non-linear element, an example will be described with reference to FIGS. 4A and 4B, in which the two-terminal type diode described in Embodiment 1 is changed into a three-terminal type diode with the use of a field effect transistor, for example, a thin film transistor.

Figure 4A:
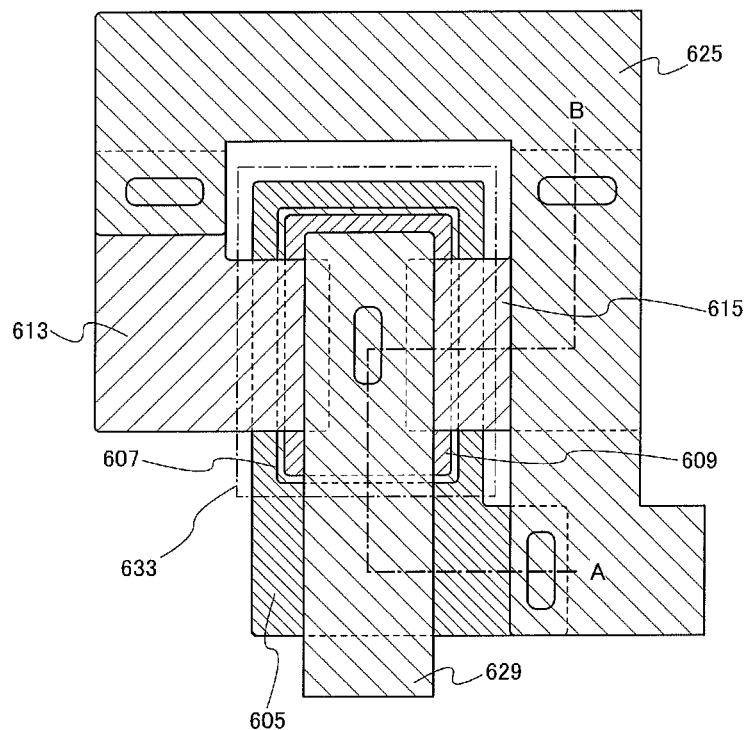
FIGS. 4A and 4B are a top view and a cross-sectional view illustrating a diode according to an embodiment of the present invention.
Figure 4B:
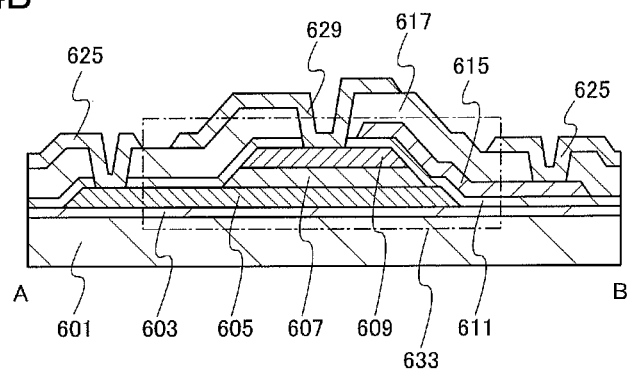

FIGS. 4A and 4B illustrate a vertical thin film transistor as an example of a thin film transistor described in this embodiment. FIG. 4A is a top view of a thin film transistor 633, and FIG. 4B is a cross-sectional view along dashed-and-dotted line A-B in FIG. 4A.

As illustrated in FIGS. 4A and 4B, a first electrode 605, an oxide semiconductor layer 607, and a second electrode 609 are stacked over an insulating film 603 formed over a substrate 601. A gate insulating film 611 is provided so as to cover the first electrode 605, the oxide semiconductor layer 607, and the second electrode 609. A third electrode 613 and a third electrode 615 are provided over the gate insulating film 611. An insulating film 617 serving as an interlayer insulating film is provided over the gate insulating film 611 and the third electrodes 613 and 615. Openings are formed in the insulating film 617, and a wiring 625 (see FIG. 4A) connected to the first electrode 605 through the opening, a wiring 629 connected to the second electrode 609 through the opening, and a wiring 625 connected to the third electrode 613 and the third electrode 615 each through the opening are formed. The first electrode 605 serves as a drain electrode of the thin film transistor. The second electrode 609 serves as a source electrode of the thin film transistor. The third electrode 613 and the third electrode 615 serve as a gate electrode of the thin film transistor and are electrically connected to the first electrode 605 through the wiring 625.

A work function ($\phi$md) of a conductive material used for the first electrode 605 which is in contact with the oxide semiconductor layer 607 and serves as a drain electrode, electron affinity ($\chi$) of the oxide semiconductor layer 607, and a work function ($\phi$ms) of a conductive material used for the second electrode 609 which is in contact with the oxide semiconductor layer 607 and serves as a source electrode satisfy Formula 2.

$$\phi ms \leq \chi < \phi md \quad \text{Formula 2}$$

Further, in this embodiment, the first electrode 605 serving as a drain electrode, and the third electrode 613 and the third electrode 615 serving as a gate electrode are electrically connected to each other. With this structure, when voltage (positive voltage) that is higher than that of the source electrode is applied to the drain electrode, positive voltage is also applied to the gate electrode; thus, the thin film transistor is in an on state and forward current flows more easily. On the other hand, when voltage (negative voltage) that is lower than that of the source electrode is applied to the drain electrode, the thin film transistor is in an off state and reverse current flows with more difficulty. Accordingly, a rectification property of the diode can be enhanced.

Figure 5A:
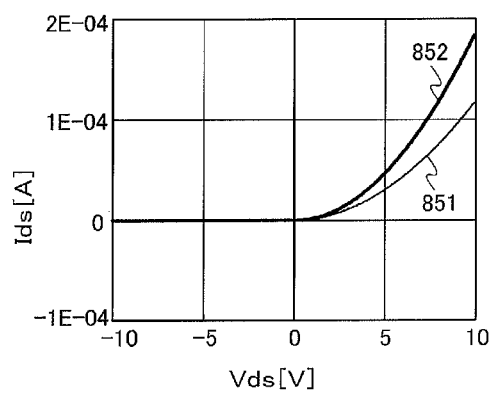
FIGS. 5A and 5B are graphs showing a simulation result of a diode according to an embodiment of the present invention.
Figure 5B:
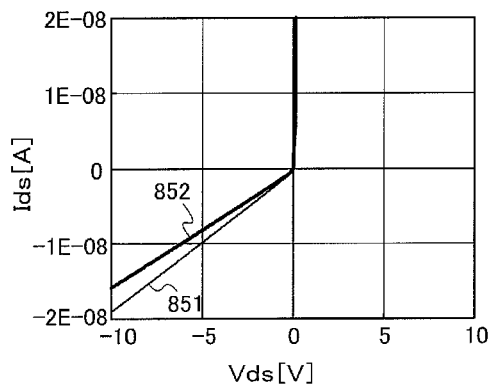

FIGS. 5A and 5B show the current vs. voltage characteristics of the two-terminal type diode and the three-terminal type diode which were obtained by device simulation. A curve 851 in each of FIGS. 5A and 5B shows a simulation result of the current vs. voltage characteristics of the two-terminal type diode, and a curve 852 in each of FIGS. 5A and 5B shows a simulation result of the current vs. voltage characteristics of the three-terminal type diode.

For the device simulation, software ATLAS which was made by Silvaco Data Systems Inc. was used. The work function ($\phi$ms) of the conductive layer serving as the cathode (source) was 4.3 eV, the electron affinity ($\chi$) of the oxide semiconductor layer was 4.3 eV, the work function ($\phi$md) of the conductive layer serving as the anode (drain) was 4.7 eV, a distance between the anode and the cathode (a channel length) was 500 nm, and a contact area of the anode, the cathode, and the oxide semiconductor layer was 1 $\mu m^2$; the simulation was performed under this condition. In addition, the simulation was performed by setting a thickness and a relative dielectric constant of a gate insulating film of a thin film transistor which is used as the three-terminal type diode to 100 nm and 4.0.

In each of FIGS. 5A and 5B, the horizontal axis represents voltage (Vds) between the anode and the cathode (between the drain and the source), and the positive side shows forward voltage and the negative side shows reverse voltage. The vertical axis represents current (Ids) between the anode and the cathode (between the drain and the source). In addition, the curve 851 represents the current vs. voltage characteristics of the two-terminal type diode, and the curve 852 represents the current vs. voltage characteristics of the three-terminal type diode.

It is confirmed from FIG. 5A that both the curve 851 and the curve 852 show the rectification property. In addition, a larger amount of forward current flows through the three-terminal type diode (the curve 852) than through the two-terminal type diode (the curve 851).

In FIG. 5B, the scale of the vertical axis (Ids) of FIG. 5A is changed so that a difference in reverse current between the curve 851 and the curve 852 can be clear. It is confirmed from FIG. 5B that a smaller amount of reverse current flows through the three-terminal type diode (the curve 852) than through the two-terminal type diode (the curve 851).

According to the simulation results shown in FIGS. 5A and 5B, a more favorable rectification property can be obtained in the three-terminal type diode than in the two-terminal type diode.

When the three-terminal type diode is manufactured with the use of the thin film transistor having a structure in which the work functions of the source electrode and the drain electrode and the electron affinity of the oxide semiconductor layer satisfy Formula 2, a diode having a more excellent rectification property can be achieved.

Although the vertical thin film transistor is described in this embodiment, a lateral thin film transistor can also be used.

(Embodiment 3)

In this embodiment, an example of the structure of the diode which is described in Embodiment 2 according to an embodiment of the present invention will be described with reference to FIGS. 6A and 6B. The diode which is described in this embodiment can be obtained by connecting a source electrode or a drain electrode of a field effect transistor, for example, a thin film transistor to a gate electrode thereof.

Figure 6A:
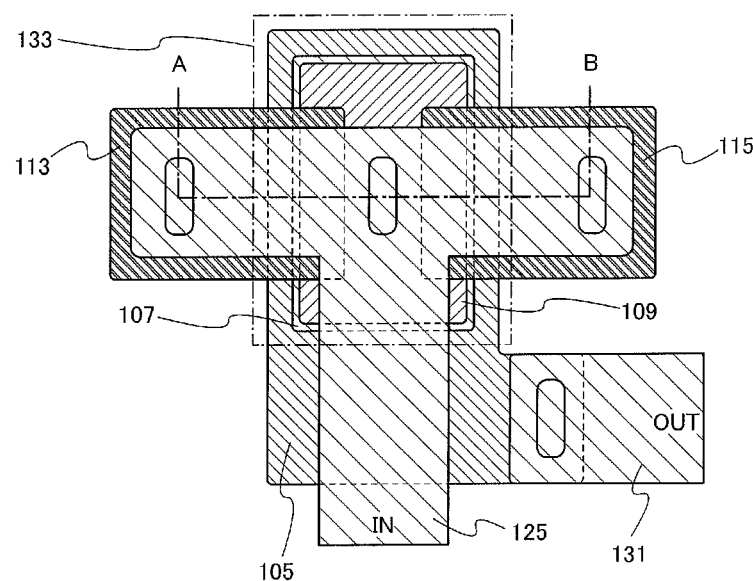
FIGS. 6A and 6B are a top view and a cross-sectional view illustrating a diode according to an embodiment of the present invention.
Figure 6B:
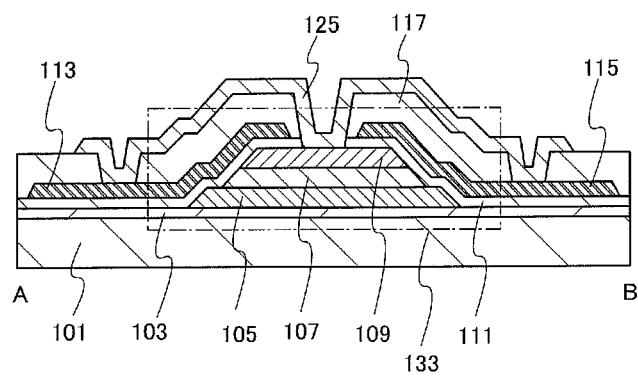

In the diode illustrated in FIGS. 6A and 6B, a wiring 125 is connected to a third electrode 113, a third electrode 115, and a second electrode 109, and the second electrode 109 is connected to a first electrode 105 through an oxide semiconductor layer 107. The first electrode 105 is connected to a wiring 131.

FIG. 6A is a top view of a diode-connected thin film transistor 133. FIG. 6B is a cross-sectional view along dashed-and-dotted line A-B in FIG. 6A.

As illustrated in FIG. 6B, the first electrode 105, the oxide semiconductor layer 107, and the second electrode 109 are stacked over an insulating film 103 formed over a substrate 101. A gate insulating film 111 is provided so as to cover the first electrode 105, the oxide semiconductor layer 107, and the second electrode 109. A third electrode 113 and a third electrode 115 are provided over the gate insulating film 111. An insulating film 117 serving as an interlayer insulating film is provided over the gate insulating film 111, the third electrode 113, and the third electrode 115. Openings are formed in the insulating film 117. The wiring 131 connected to the first electrode 105 through the opening (see FIG. 6A), and the wiring 125 connected to the second electrode 109, the third electrode 113, and the third electrode 115 each through the opening are formed. The first electrode 105 serves as one of a source electrode and a drain electrode of the thin film transistor. The second electrode 109 serves as the other of the source electrode and the drain electrode of the thin film transistor. The third electrode 113 and the third electrode 115 serve as a gate electrode of the thin film transistor.

The thin film transistor according to this embodiment is a vertical thin film transistor, which has features that the third electrode 113 and the third electrode 115 which serve as a gate electrode are electrically connected to each other and that the third electrode 113 and the third electrode 115 face each other with the first electrode 105, the oxide semiconductor layer 107 and the second electrode 109 interposed therebetween.

A thin film transistor is an element having at least three terminals of a gate, a drain, and a source. The thin film transistor has a channel formation region in a semiconductor layer between a drain and a source, and current can flow through the drain, the channel formation region, and the source. Here, since the source and the drain of the thin film transistor may be switched depending on a structure, operating conditions, and the like of the thin film transistor, it is difficult to define which is the source or the drain. Therefore, a region serving as the source or the drain is not called the source or the drain in some cases. In such a case, for example, one of the source and the drain may be referred to as a first terminal and the other thereof may be referred to as a second terminal. Alternatively, one of the source and the drain may be referred to as a first electrode and the other thereof may be referred to as a second electrode. Further alternatively, one of the source and the drain may be referred to as a first region and the other thereof may be referred to as a second region.

Further, functions of the source and the drain might be switched when a transistor having a different polarity is employed or a direction of current flow is changed in circuit operation, for example. Therefore, the terms "source" and "drain" can be switched in this specification.

It is necessary that the substrate 101 have at least heat resistance high enough to withstand heat treatment to be performed later. As the substrate 101, a glass substrate of barium borosilicate glass, aluminoborosilicate glass, or the like can be used.

In the case where the temperature of the heat treatment to be performed later is high, a glass substrate whose strain point is greater than or equal to 730° C. is preferably used. As a glass substrate, a glass material such as aluminosilicate glass, aluminoborosilicate glass, or barium borosilicate glass is used, for example. Note that more practical glass with heat resistance can be obtained when it contains a larger amount of barium oxide (BaO) than boron oxide ($B_2O_3$). Therefore, a glass substrate containing BaO and $B_2O_3$ so that the amount of BaO is larger than that of $B_2O_3$ is preferably used.

Note that a substrate formed of an insulator, such as a ceramic substrate, a quartz substrate, or a sapphire substrate, may be used instead of the glass substrate. Alternatively, crystallized glass or the like can be used.

The insulating film 103 is formed using an oxide insulating film such as a silicon oxide film or a silicon oxynitride film; or a nitride insulating film such as a silicon nitride film, a silicon nitride oxide film, an aluminum nitride film, or an aluminum nitride oxide film. In addition, the insulating film 103 may have a stacked structure, for example, a stacked structure in which one or more of the nitride insulating films and one or more of the oxide insulating film are stacked in that order over the substrate 101.

The first electrode 105 and the second electrode 109 are formed using an element selected from aluminum, chromium, iron, copper, tantalum, titanium, molybdenum, tungsten, yttrium, and silver; an alloy containing any of these elements as a component; an alloy containing any of these elements in combination; or the like. Alternatively, one or more materials selected from manganese, magnesium, zirconium, beryllium, and thorium can be used. In addition, the first electrode 105 and the second electrode 109 can have a single-layer structure or a stacked structure having two or more layers. For example, a single-layer structure of an aluminum film containing silicon; a two-layer structure of an aluminum film and a titanium film stacked thereover; a two-layer structure of a tungsten film and a titanium film stacked thereover; a three-layer structure in which a titanium film, an aluminum film, and a titanium film are stacked in that order; and the like can be given. Alternatively, a film or an alloy film which contains aluminum and one or more elements selected from titanium, tantalum, tungsten, molybdenum, chromium, neodymium, and scandium, or a nitride film thereof may be used. In addition, indium tin oxide (ITO) or the like can be used.

As the oxide semiconductor layer 107, a thin film of a material expressed by $InMO_3(ZnO)_m$ (m>0) can be used. Here, M represents one or more metal elements selected from Ga, Fe, Ni, Mn, and Co. For example, M may be Ga, Ga and Ni, Ga and Fe, or the like. The oxide semiconductor layer may contain a transition metal element or an oxide of the transition metal element as an impurity element in addition to the metal element contained as M. An oxide semiconductor whose composition formula is represented as $InMO_3(ZnO)_m$ (m>0) where Ga is contained as M is referred to as an In—Ga—Zn—O-based oxide semiconductor, and a thin film thereof is referred to as an In—Ga—Zn—O-based film.

As the oxide semiconductor layer 107, any of the following oxide semiconductors can be used besides the In—Ga—Zn—O-based oxide semiconductor: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—Ga—O-based oxide semiconductor; an In—O-based oxide semiconductor; a Sn—O-based oxide semiconductor; and a Zn—O-based oxide semiconductor. Further, $SiO_2$ may be contained in the above oxide semiconductor.

In the oxide semiconductor layer 107 used in this embodiment, the hydrogen concentration is less than or equal to $5 \times 10^{19}/cm^3$, preferably less than or equal to $5 \times 10^{18}/cm^3$, more preferably less than or equal to $5 \times 10^{17}/cm^3$, that is, hydrogen contained in the oxide semiconductor is reduced. In other words, the oxide semiconductor layer is highly purified so that impurities that are not main components of the oxide semiconductor are contained as little as possible. The carrier concentration of the oxide semiconductor layer 107 is less than or equal to $5 \times 10^{14}/cm^3$, preferably less than or equal to $1 \times 10^{14}/cm^3$, more preferably less than or equal to $5 \times 10^{12}/$ cm³, still more preferably less than or equal to $1\times10^{12}/\text{cm}^3$. That is, the carrier concentration of the oxide semiconductor is as close to zero as possible. Furthermore, the energy gap is greater than or equal to 2 eV, preferably greater than or equal to 2.5 eV, more preferably greater than or equal to 3 eV. Note that the hydrogen concentration in the oxide semiconductor can be measured by SIMS. In addition, the carrier concentration can be measured by the Hall effect measurement.

The thickness of the oxide semiconductor layer 107 may be 30 nm to 3000 nm inclusive. When the thickness of the oxide semiconductor layer 107 is small, the channel length of the thin film transistor can be decreased; thus, a thin film transistor having large on current and high field-effect mobility can be manufactured. On the other hand, when the thickness of the oxide semiconductor layer 107 is large, typically 100 nm to 3000 nm inclusive, a semiconductor device for high power can be manufactured.

The gate insulating film 111 can be a single-layer or a stack formed using any of a silicon oxide film, a silicon nitride film, a silicon oxynitride film, a silicon nitride oxide film, and an aluminum oxide film. A portion of the gate insulating film 111 which is in contact with the oxide semiconductor layer 107 preferably contains oxygen, and in particular, the portion of the gate insulating film 111 is preferably formed using a silicon oxide film. By using a silicon oxide film, oxygen can be supplied to the oxide semiconductor layer 107 and favorable characteristics can be obtained. The thickness of the gate insulating film 111 may be 50 nm to 500 nm inclusive. When the thickness of the gate insulating film 111 is small, a thin film transistor having high field-effect mobility can be manufactured; thus, a driver circuit can be manufactured over the same substrate as the thin film transistor. In contrast, when the thickness of the gate insulating film 111 is large, gate leakage current can be reduced.

When the gate insulating film 111 is formed using a high-k material such as hafnium silicate ($HfSi_xO_y$, (x>0, y>0)), $HfSi_xO_y$, (x>0, y>0) to which nitrogen is added, hafnium aluminate ($HfAl_xO_y$, (x>0, y>0)) to which nitrogen is added, hafnium oxide, or yttrium oxide, gate leakage current can be reduced. Further, a stacked structure can be used in which a high-k material and one or more of a silicon oxide film, a silicon nitride film, a silicon oxynitride film, a silicon nitride oxide film, and an aluminum oxide film are stacked.

The third electrode 113 and the third electrode 115 serving as a gate electrode are formed using an element selected from aluminum, chromium, copper, tantalum, titanium, molybdenum, and tungsten; an alloy containing any of these elements as a component; an alloy containing any of these elements in combination; or the like. Alternatively, one or more materials selected from manganese, magnesium, zirconium, and beryllium may be used. In addition, the third electrode 113 and the third electrode 115 can have a single-layer structure or a stacked structure having two or more layers. For example, a single-layer structure of an aluminum film containing silicon; a two-layer structure of an aluminum film and a titanium film stacked thereover; a three-layer structure in which a titanium film, an aluminum film, and a titanium film are stacked in that order; and the like can be given. Alternatively, a film or an alloy film which contains aluminum and one or more elements selected from titanium, tantalum, tungsten, molybdenum, chromium, neodymium, and scandium, or a nitride film thereof may be used.

The oxide semiconductor in this embodiment is an intrinsic (i-type) or substantially intrinsic oxide semiconductor obtained by removal of hydrogen, which is an n-type impurity, from the oxide semiconductor and the increase in purity so that an impurity other than the main components of the oxide semiconductor is not included as much as possible. In other words, the oxide semiconductor in this embodiment is a highly purified intrinsic (i-type) oxide semiconductor or an oxide semiconductor which is close to a highly purified intrinsic oxide semiconductor obtained not by addition of an impurity but by removal of an impurity such as hydrogen, water, a hydroxyl group, or hydride as much as possible. In this manner, the Fermi level ($E_f$) can be the same level as the intrinsic Fermi level ($E_i$).

By removing the impurity as much as possible as described above, for example, even when the channel width W of the thin film transistor is $1\times10^4$ μm and the channel length thereof is 3 μm, off current can be less than or equal to $10^{-13}$ A, which is extremely small, and a subthreshold swing (S value) can be less than or equal to 0.1 V/dec. (the gate insulating film with a thickness of 100 nm).

As described above, when the oxide semiconductor layer is highly purified so that impurities that are not main components of the oxide semiconductor, typically hydrogen, water, a hydroxyl group, or hydride, are contained as little as possible, favorable operation of the thin film transistor can be obtained. In particular, off current can be reduced.

A lateral thin film transistor in which a channel is formed substantially in parallel with a substrate needs a source and a drain as well as the channel, so that an area occupied by the thin film transistor in the substrate is increased, which hinders miniaturization. However, a source, a channel, and a drain are stacked in a vertical thin film transistor, whereby an area occupied by the thin film transistor in a substrate surface can be reduced. As a result of this, it is possible to miniaturize the thin film transistor.

The channel length of the vertical thin film transistor can be controlled by the thickness of the oxide semiconductor layer; therefore, when the oxide semiconductor layer 107 is formed to have a small thickness, a thin film transistor having a short channel length can be provided. When the channel length is reduced, series resistance of the source, the channel, and the drain can be reduced; therefore, on current and field-effect mobility of the thin film transistor can be increased. In addition, a thin film transistor having the highly purified oxide semiconductor layer whose hydrogen concentration is reduced is in an insulating state where off current is extremely small and almost no current flows when the thin film transistor is off. Therefore, even when the thickness of the oxide semiconductor layer is decreased to reduce the channel length of the vertical thin film transistor, a thin film transistor in which almost no off current flows in a non-conduction state can be provided.

As described above, using a highly purified oxide semiconductor layer whose hydrogen concentration is reduced makes it possible to manufacture a thin film transistor which is suitable for higher definition and has high operation speed and in which a large amount of current can flow in an on state and almost no current flows in an off state.

Note that the diode described in this embodiment is not limited to that illustrated in FIGS. 6A and 6B. In the diode illustrated in FIGS. 6A and 6B, current flows through the oxide semiconductor layer 107 from the second electrode 109 to the first electrode 105. A structure in which current flows through the oxide semiconductor layer 107 from the first electrode 105 to the second electrode 109 as illustrated in FIGS. 7A and 7B may be employed.

Figure 7A:
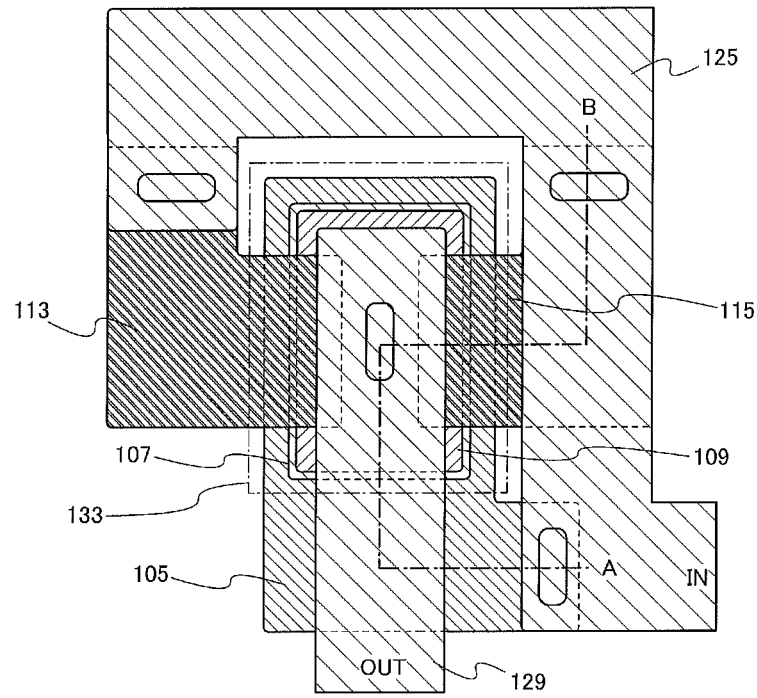
FIGS. 7A and 7B are a top view and a cross-sectional view illustrating a diode according to an embodiment of the present invention.
Figure 7B:
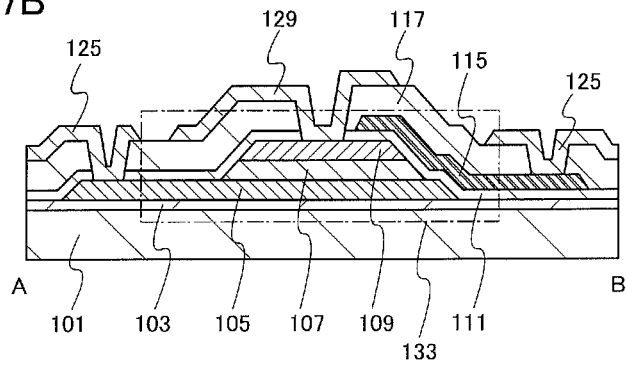

In a diode illustrated in FIGS. 7A and 7B, a wiring 125 is connected to a third electrode 113, a third electrode 115, and a first electrode 105. The first electrode 105 is connected to a second electrode 109 through an oxide semiconductor layer 107. The second electrode 109 is connected to a wiring 129.

In the diode illustrated in FIGS. 7A and 7B, the wiring 125 is provided so as not to overlap with other electrodes and the like; therefore, parasitic capacitance generated between the wiring 125 and other electrodes can be suppressed.

By electrically connecting one of a source electrode and a drain electrode of a thin film transistor to a gate electrode thereof as described above, a diode in which reverse current is very small can be obtained. Therefore, a diode which is resistant to a breakdown (i.e., has high withstand voltage) can be manufactured. In addition, a work function of a material used for a region which is in contact with an oxide semiconductor layer in one of a source electrode and a drain electrode electrically connected to a gate electrode is $\phi md$, a work function of a material used for a region of the other of the source electrode and the drain electrode which is in contact with the oxide semiconductor layer is $\phi ms$, and electron affinity of the oxide semiconductor layer is $\chi$. When $\phi md$, $\phi ms$, and $\chi$ satisfy a condition shown in Formula 2, a diode which has a more excellent rectification property and is resistant to a breakdown can be obtained.

(Embodiment 4)

In this embodiment, an example of a diode, which is an embodiment of a non-linear element and different from that in Embodiment 3, will be described with reference to FIGS. 8A and 8B. The diode which is described in this embodiment can be obtained by connecting a source or a drain of a field effect transistor, for example, a thin film transistor to a gate thereof.

Figure 8A:
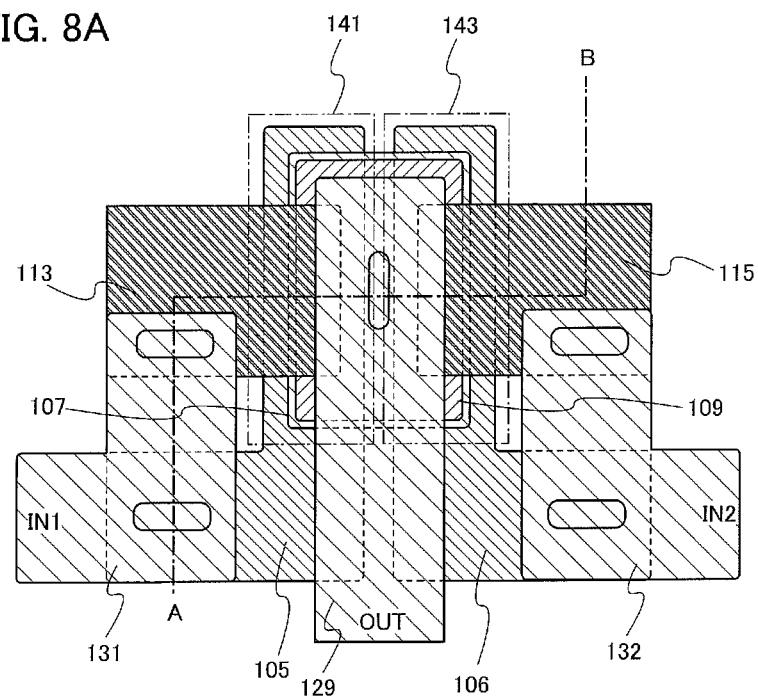
FIGS. 8A and 8B are a top view and a cross-sectional view illustrating a diode according to an embodiment of the present invention.
Figure 8B:
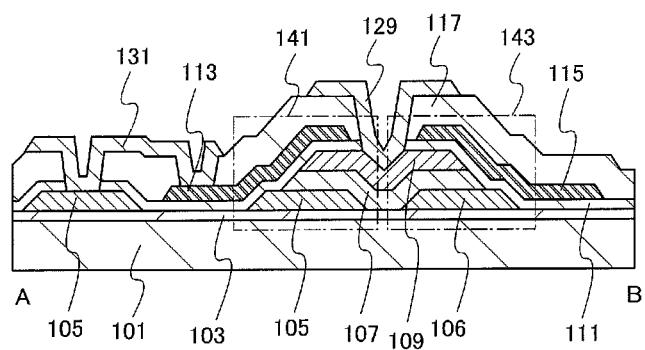

In the diode illustrated in FIGS. 8A and 8B, a wiring 131 is connected to a first electrode 105 and a third electrode 113, and a wiring 132 is connected to a first electrode 106 and a third electrode 115. The first electrode 105 and the first electrode 106 are connected to a second electrode 109 through an oxide semiconductor layer 107. The second electrode 109 is connected to a wiring 129.

FIG. 8A is a top view of diode-connected thin film transistor 141 and thin film transistor 143. FIG. 8B is a cross-sectional view along dashed-and-dotted line A-B in FIG. 8A.

As illustrated in FIG. 8B, the first electrode 105, the first electrode 106, the oxide semiconductor layer 107, and the second electrode 109 are stacked over an insulating film 103 formed over a substrate 101. A gate insulating film 111 is provided so as to cover the first electrodes 105 and 106, the oxide semiconductor layer 107, and the second electrode 109. The third electrode 113 and a third electrode 115 are provided over the gate insulating film Ill. An insulating film 117 serving as an interlayer insulating film is provided over the gate insulating film 111, the third electrode 113, and the third electrode 115. Openings are formed in the insulating film 117. The wiring 131 connected to the first electrode 105 and the third electrode 113 each through the opening, a wiring 132 connected to the first electrode 106 and the third electrode 115 each through the opening (see FIG. 8A), and the wiring 129 connected to the second electrode 109 through the opening are formed.

The first electrode 105 serves as one of a source electrode and a drain electrode of the thin film transistor 141. The first electrode 106 serves as one of a source electrode and a drain electrode of the thin film transistor 143. The second electrode 109 serves as the other of the source electrode and the drain electrode of each of the thin film transistors 141 and 143. The third electrode 113 serves as a gate electrode of the thin film transistor 141. The third electrode 115 serves as a gate electrode of the thin film transistor 143.

In this embodiment, the thin film transistor 141 and the thin film transistor 143 are connected to the wiring 129 through the second electrode 109. A signal which is input to the wiring 131 is output to the wiring 129 through the thin film transistor 141, and a signal which is input to the wiring 132 is also output to the wiring 129 through the thin film transistor 143.

Although the first electrode 105 and the first electrode 106 are separated in this embodiment, by electrically connecting the first electrode 105 and the first electrode 106 to each other, the thin film transistor 141 and the thin film transistor 143 can be connected in parallel. By connecting the thin film transistors in parallel, the larger amount of current can flow.

The thin film transistors 141 and 143 of this embodiment are formed using a highly purified oxide semiconductor layer whose hydrogen concentration is reduced, in a manner similar to that of Embodiment 3. Therefore, favorable operation of the thin film transistors can be obtained. In particular, off current can be reduced. As a result of this, a thin film transistor which is suitable for higher definition and has high operation speed and in which a large amount of current can flow in an on state and almost no current flows in an off state can be manufactured. By connecting a source or a drain of a transistor to a gate thereof as described above, a diode in which forward current is large and reverse current is small can be manufactured. Therefore, a diode which is resistant to an avalanche breakdown (i.e., has high withstand voltage) can be manufactured.

Note that the diode described in this embodiment is not limited to that illustrated in FIGS. 8A and 8B. In the diode illustrated in FIGS. 8A and 8B, current flows through the oxide semiconductor layer 107 from the first electrode 105 to the second electrode 109. A structure in which current flows through the oxide semiconductor layer 107 from the second electrode 109 to the first electrode 105 as illustrated in FIGS. 9A and 9B may be employed.

Figure 9A:
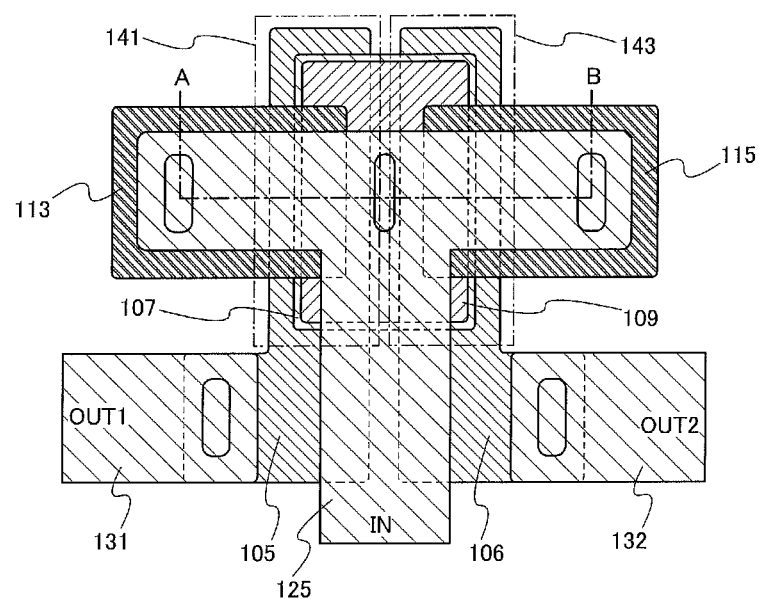
FIGS. 9A and 9B are a top view and a cross-sectional view illustrating a diode according to an embodiment of the present invention.
Figure 9B:
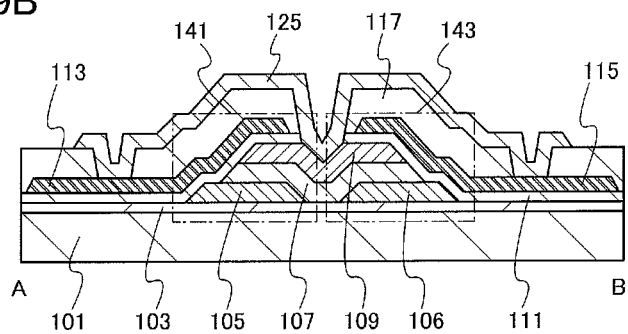

In the diode illustrated in FIGS. 9A and 9B, a wiring 125 is connected to a third electrode 113, a third electrode 115, and a second electrode 109. The second electrode 109 is connected to a first electrode 105 and a first electrode 106 through an oxide semiconductor layer 107. The first electrode 105 is connected to a wiring 131, and the first electrode 106 is connected to a wiring 132.

In the diode illustrated in FIGS. 9A and 9B, the wiring 125 is provided so as to overlap with a thin film transistor 141 and a thin film transistor 143. However, without limitation thereto, the wiring 125 may be provided so as not to overlap with the thin film transistor 141 and the thin film transistor 143 as in FIGS. 7A and 7B. When the wiring 125 does not overlap with the thin film transistor 141 and the thin film transistor 143, parasitic capacitance generated between the wiring 125 and electrodes of the thin film transistors can be suppressed.

By electrically connecting one of a source electrode and a drain electrode of a thin film transistor to a gate electrode thereof as described above, a diode in which reverse current is very small can be obtained. Therefore, a diode which is resistant to a breakdown (i.e., has high withstand voltage) can be manufactured. In addition, a work function of a material used for a region which is in contact with an oxide semiconductor layer in one of a source electrode and a drain electrode electrically connected to a gate electrode is $\phi md$, a work function of a material used for a region of the other of the source electrode and the drain electrode which is in contact with the oxide semiconductor layer is $\phi ms$, and electron affinity of the oxide semiconductor layer is $\chi$. When $\phi md$, $\phi ms$, and $\chi$ satisfy a condition shown in Formula 2, a diode which has a more excellent rectification property and is resistant to a breakdown can be obtained.

(Embodiment 5)

In this embodiment, an example of a diode, which is an embodiment of a non-linear element and different from those in Embodiments 3 and 4, will be described with reference to FIGS. 10A and 10B. The diode which is described in this embodiment can be obtained by connecting a source or a drain of a field effect transistor, for example, a thin film transistor to a gate thereof.

Figure 10A:
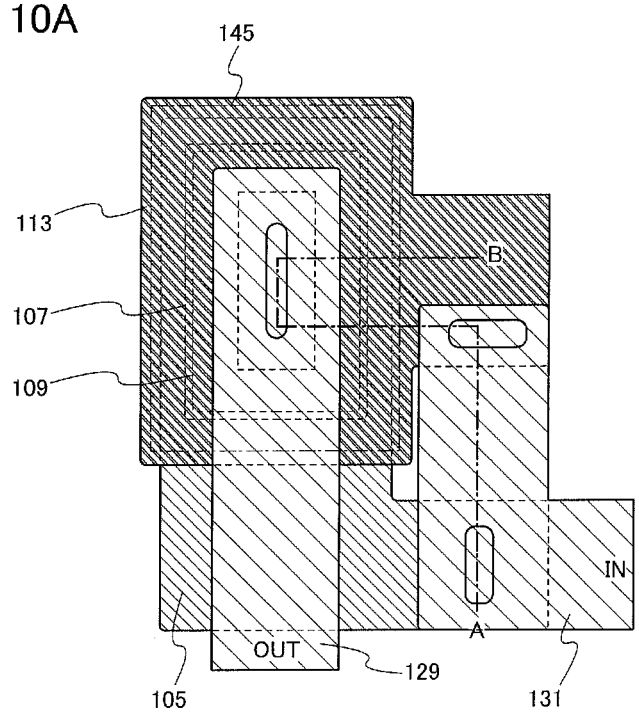
FIGS. 10A and 10B are a top view and a cross-sectional view illustrating a diode according to an embodiment of the present invention.
Figure 10B:
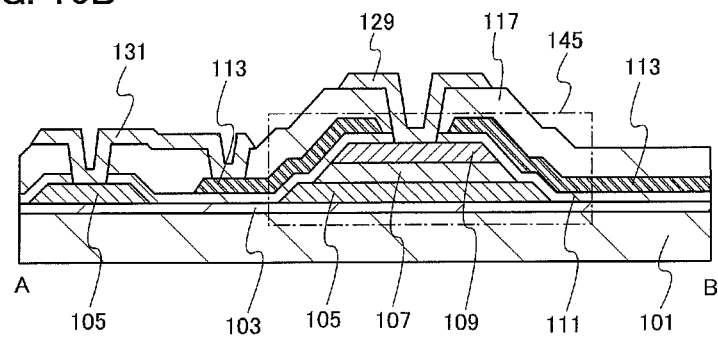

In the diode illustrated in FIGS. 10A and 10B, a wiring 131 is connected to a first electrode 105 and a third electrode 113. The first electrode 105 is connected to a second electrode 109 through an oxide semiconductor layer 107. The second electrode 109 is connected to a wiring 129.

FIG. 10A is a top view of a diode-connected thin film transistor 145. FIG. 10B is a cross-sectional view along dashed-and-dotted line A-B in FIG. 10A.

As illustrated in FIG. 10B, the first electrode 105, the oxide semiconductor layer 107, and the second electrode 109 are stacked over an insulating film 103 formed over a substrate 101. A gate insulating film 111 is provided so as to cover the first electrode 105, the oxide semiconductor layer 107, and the second electrode 109. The third electrode 113 is provided over the gate insulating film 111. The insulating film 117 serving as an interlayer insulating film is provided over the gate insulating film 111 and the third electrode 113. Openings are formed in the insulating film 117. The wiring 131 connected to the first electrode 105 and the third electrode 113 each through the opening (see FIG. 10A), and a wiring 129 connected to the second electrode 109 through the opening are formed.

The first electrode 105 serves as one of a source electrode and a drain electrode of the thin film transistor 145. The second electrode 109 serves as the other of the source electrode and the drain electrode of the thin film transistor 145. The third electrode 113 serves as a gate electrode of the thin film transistor 145.

In this embodiment, the third electrode 113 serving as the gate electrode has a ring shape. When the third electrode 113 serving as the gate electrode has a ring shape, the channel width of the thin film transistor can be increased. Accordingly, on current of the thin film transistor can be increased.

The thin film transistor 145 of this embodiment is formed using a highly purified oxide semiconductor layer whose hydrogen concentration is reduced, in a manner similar to that of Embodiment 3. Therefore, favorable operation of the thin film transistor can be obtained. In particular, off current can be reduced. As a result of this, a thin film transistor which is suitable for higher definition and has high operation speed and in which a large amount of current can flow in an on state and almost no current flows in an off state can be manufactured.

Note that the diode described in this embodiment is not limited to that illustrated in FIGS. 10A and 10B. In the diode illustrated in FIGS. 10A and 10B, current flows through the oxide semiconductor layer 107 from the first electrode 105 to the second electrode 109. A structure in which current flows through the oxide semiconductor layer 107 from the second electrode 109 to the first electrode 105 as illustrated in FIGS. 11A and 11B may be employed.

Figure 11A:
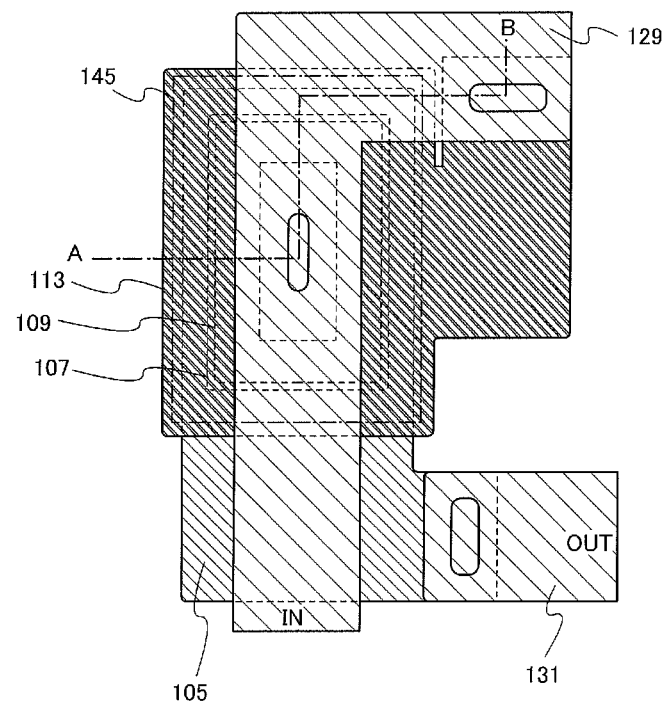
FIGS. 11A and 11B are a top view and a cross-sectional view illustrating a diode according to an embodiment of the present invention.
Figure 11B:
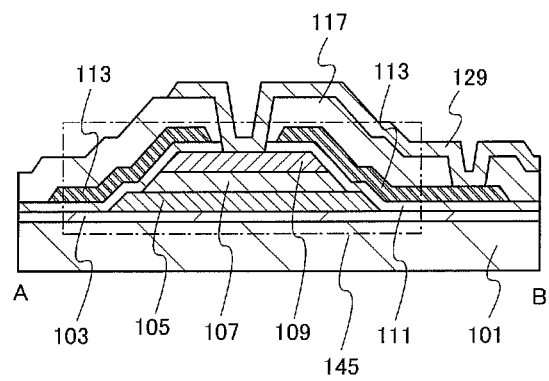

In the diode illustrated in FIGS. 11A and 11B, a wiring 129 is connected to a second electrode 109 and a third electrode 113. The second electrode 109 is connected to a first electrode 105 through an oxide semiconductor layer 107. The first electrode 105 is connected to a wiring 131.

By electrically connecting a source electrode or a drain electrode of a thin film transistor to a gate electrode thereof as described above, a diode in which reverse current is very small can be obtained. Therefore, a diode which is resistant to a breakdown (i.e., has high withstand voltage) can be manufactured. In addition, a work function of a material used for a region which is in contact with an oxide semiconductor layer in one of a source electrode and a drain electrode electrically connected to a gate electrode is $\phi md$, a work function of a material used for a region of the other of the source electrode and the drain electrode which is in contact with the oxide semiconductor layer is $\phi ms$, and electron affinity of the oxide semiconductor layer is $\chi$. When $\phi md$, $\phi ms$, and $\chi$ satisfy a condition shown in Formula 2, a diode which has a more excellent rectification property and is resistant to a breakdown can be obtained.

(Embodiment 6)

In this embodiment, manufacturing steps of the diode-connected thin film transistor illustrated in FIGS. 6A and 6B will be described with reference to FIGS. 12A to 12E.

Figure 12A:
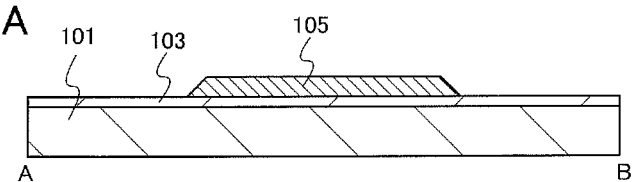
FIGS. 12A to 12E are cross-sectional views illustrating a method for manufacturing a diode according to an embodiment of the present invention.

As illustrated in FIG. 12A, the insulating film 103 is formed over the substrate 101, and the first electrode 105 is formed over the insulating film 103. The first electrode 105 serves as one of the source electrode and the drain electrode of the thin film transistor.

The insulating film 103 can be formed by a sputtering method, a CVD method, a coating method, or the like.

Note that when the insulating film 103 is formed by a sputtering method, the insulating film 103 is preferably formed while hydrogen, water, a hydroxyl group, hydride, or the like remaining in a treatment chamber is removed. This is for preventing hydrogen, water, a hydroxyl group, hydride, or the like from being contained in the insulating film 103. It is preferable to use an entrapment vacuum pump in order to remove hydrogen, water, a hydroxyl group, hydride, or the like remaining in the treatment chamber. As the entrapment vacuum pump, a cryopump, an ion pump, or a titanium sublimation pump is preferably used, for example. Further, an evacuation unit may be a turbo pump provided with a cold trap. Since hydrogen, water, a hydroxyl group, hydride, or the like is removed from the treatment chamber which is evacuated using a cryopump, by forming the insulating film 103 in the treatment chamber, the concentration of impurities contained in the insulating film 103 can be reduced.

As a sputtering gas used for forming the insulating film 103, a high-purity gas is preferably used in which impurities such as hydrogen, water, a hydroxyl group, or hydride are reduced to a concentration of a ppm level or a ppb level.

Examples of a sputtering method include an RF sputtering method in which a high-frequency power source is used for a sputtering power source, a DC sputtering method in which a DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a sputtering method, there are also a reactive sputtering method in which a target substance and a sputtering gas component are chemically reacted with each other during deposition to form a thin compound film thereof, and a bias sputtering method in which voltage is also applied to a substrate during deposition.

As the sputtering in this specification, the above-described sputtering apparatus and the sputtering method can be employed as appropriate.

In this embodiment, the substrate 101 is transferred to the treatment chamber. A high-purity sputtering gas containing oxygen, from which hydrogen, water, a hydroxyl group, hydride, or the like is removed, is introduced into the treatment chamber, and a silicon oxide film is formed as the insulating film 103 over the substrate 101 using a silicon target. Note that when the insulating film 103 is formed, the substrate 101 may be heated.

For example, the silicon oxide film is formed by an RF sputtering method under the following conditions: quartz (preferably, synthesized quartz) is used; the substrate temperature is 108° C., the distance between the substrate and the target (the T-S distance) is 60 mm; the pressure is 0.4 Pa; the electric power of the high frequency power source is 1.5 kW; and the atmosphere contains oxygen and argon (the flow ratio of oxygen to argon is 1:1 (each flow rate is 25 sccm)). The film thickness may be 100 nm, for example. Note that instead of quartz (preferably, synthesized quartz), a silicon target can be used. Note that as the sputtering gas, oxygen, or a mixed gas of oxygen and argon is used.

For example, when the insulating film 103 is formed using a stacked structure, a silicon nitride film is formed using a silicon target and a high-purity sputtering gas containing nitrogen, from which hydrogen, water, a hydroxyl group, hydride, or the like is removed, between the silicon oxide film and the substrate. Also in this case, it is preferable that the silicon nitride film be formed while hydrogen, water, a hydroxyl group, hydride, or the like remaining in the treatment chamber is removed in a manner similar to that of the silicon oxide film. Note that in the process, the substrate 101 may be heated.

When a silicon nitride film and a silicon oxide film are stacked as the insulating film 103, a silicon nitride film and a silicon oxide film can be formed using a common silicon target in the same treatment chamber. A sputtering gas containing nitrogen is introduced into the treatment chamber first, and a silicon nitride film is formed using a silicon target provided in the treatment chamber; next, the sputtering gas containing nitrogen is switched to a sputtering gas containing oxygen and a silicon oxide film is formed using the same silicon target. The silicon nitride film and the silicon oxide film can be formed in succession without being exposed to the air; therefore, impurities such as hydrogen, water, a hydroxyl group, or hydride can be prevented from being attached to the surface of the silicon nitride film.

The first electrode 105 can be formed in such a manner that a conductive film is formed over the substrate 101 by a sputtering method, a CVD method, or a vacuum evaporation method, a resist mask is formed over the conductive film in a photolithography step, and the conductive film is etched using the resist mask. When the first electrode 105 is formed by a printing method or an ink-jet method without using a photolithography step, the number of steps can be reduced. Note that end portions of the first electrode 105 preferably have a tapered shape, so that the coverage with the gate insulating film to be formed later can be improved. When the angle between the end portion of the first electrode 105 and the insulating film 103 is 30° to 60° inclusive, preferably 40° to 50° inclusive, the coverage with the gate insulating film to be formed later can be improved.

As the conductive film for forming the first electrode 105, a single layer or stacked layers using one or more of tungsten (W), molybdenum (Mo), chromium (Cr), iron (Fe), indium tin oxide (ITO), titanium (Ti), yttrium (Y), aluminum (Al), magnesium (Mg), silver (Ag), zirconium (Zr), and the like can be used.

In this embodiment, in consideration of a condition shown in Formula 2 described in the above embodiment, a titanium film with a thickness of 50 nm, an aluminum film with a thickness of 100 nm, and a titanium film with a thickness of 50 nm are formed by a sputtering method as the conductive film for forming the first electrode 105. Then, the conductive film is etched with the use of a resist mask formed through a photolithography step, thereby forming the first electrode 105.

Figure 12B:
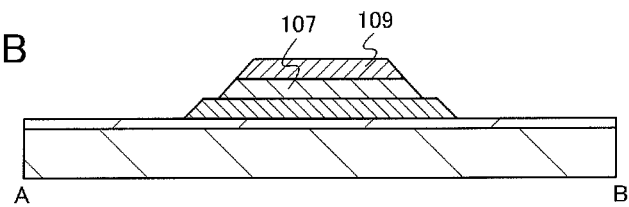

Next, as illustrated in FIG. 12B, the oxide semiconductor layer 107 and the second electrode 109 are formed over the first electrode 105. The oxide semiconductor layer 107 serves as a channel formation region of the thin film transistor, and the second electrode 109 serves as the other of the source electrode and the drain electrode of the thin film transistor.

Here, a method for manufacturing the oxide semiconductor layer 107 and the second electrode 109 is described.

An oxide semiconductor film is formed by a sputtering method over the substrate 101 and the first electrode 105. Next, a conductive film is formed over the oxide semiconductor film.

As pretreatment, it is preferable that the substrate 101 provided with the first electrode 105 be preheated in a preheating chamber of a sputtering apparatus and impurities such as hydrogen, water, a hydroxyl group, or hydride attached to the substrate 101 be eliminated and removed so that hydrogen is contained in the oxide semiconductor layer 107 as little as possible. Note that a cryopump is preferable for an evacuation unit provided in the preheating chamber. Note that this preheating treatment can be omitted. In addition, this preheating may be performed on the substrate 101 before the formation of the gate insulating film 111 which is formed later, or may be performed on the substrate 101 before the formation of the third electrode 113 and the third electrode 115 which are formed later.

In this embodiment, the oxide semiconductor is formed by a sputtering method with the use of an In—Ga—Zn—O-based metal oxide target. In addition, the oxide semiconductor can be formed by a sputtering method in a rare gas (typically argon) atmosphere, an oxygen atmosphere, or an atmosphere containing a rare gas (typically argon) and oxygen. When a sputtering method is employed, a target containing $SiO_2$ at 2 wt % to 10 wt % inclusive may be used.

As a sputtering gas used for forming the oxide semiconductor, a high-purity gas is preferably used in which impurities such as hydrogen, water, a hydroxyl group, or hydride are reduced to a concentration of a ppm level or a ppb level.

As a target used to form the oxide semiconductor by a sputtering method, a metal oxide target containing zinc oxide as a main component can be used. As another example of a metal oxide target, a metal oxide target containing In, Ga, and Zn (a composition ratio of $In_2O_3:Ga_2O_3:ZnO=1:1:1$ [molar ratio] or $In_2O_3:Ga_2O_3:ZnO=1:1:2$ [molar ratio]) can be used. Alternatively, as a metal oxide target containing In, Ga, and Zn, a target having a composition ratio of $In_2O_3:Ga_2O_3:ZnO=2:2:1$ [molar ratio] or $In_2O_3:Ga_2O_3:ZnO=1:1:4$ [molar ratio] can be used. The filling rate of the metal oxide target is 90% to 100% inclusive, preferably, 95% to 99.9% inclusive. An oxide semiconductor which is formed using the metal oxide target with high filling rate is dense.

The oxide semiconductor film is formed over the substrate 101 in such a manner that a sputtering gas from which hydrogen, water, a hydroxyl group, hydride, or the like is removed is introduced into the treatment chamber and a metal oxide is used as a target while the substrate is kept in the treatment chamber in a reduced-pressure state and moisture remaining in the treatment chamber is removed. It is preferable to use an entrapment vacuum pump in order to remove hydrogen, water, a hydroxyl group, hydride, or the like remaining in the treatment chamber. A cryopump, an ion pump, or a titanium sublimation pump is preferably used, for example. Further, an evacuation unit may be a turbo pump provided with a cold trap. From the treatment chamber which is evacuated using a cryopump, for example, hydrogen, water, a hydroxyl group, hydride, or the like (more preferably, also a compound containing a carbon atom) is removed; therefore, the concentration of impurities contained in the oxide semiconductor film can be reduced. The oxide semiconductor film may be formed while the substrate is heated.

In this embodiment, as an example of a film formation condition of the oxide semiconductor film, the following conditions are applied: the substrate temperature is room temperature, the distance between the substrate and the target is 110 mm; the pressure is 0.4 Pa; the electric power of the direct current (DC) power source is 0.5 kW; and the atmosphere contains oxygen and argon (the oxygen flow rate is 15 sccm, and the argon flow rate is 30 sccm). Note that a pulsed direct current (DC) power source is preferable because powder substances (also referred to as particles or dust) generated in film formation can be reduced and the film thickness can be uniform. The oxide semiconductor film preferably has a thickness of 30 nm to 3000 nm inclusive. Note that the appropriate thickness is different according to a material used for the oxide semiconductor film, and the thickness may be selected as appropriate in accordance with a material.

As the sputtering method that is used when the oxide semiconductor film is formed, the sputtering method which is employed for the insulating film 103 can be used as appropriate.

The conductive film for forming the second electrode 109 can be formed using the material and the method which are used for the first electrode 105, as appropriate. Here, in consideration of a condition shown in Formula 2 described in the above embodiment, a tungsten film with a thickness of 50 nm, an aluminum film with a thickness of 100 nm, and a titanium film with a thickness of 50 nm are sequentially stacked as the conductive film for forming the second electrode 109.

Next, a resist mask is formed over the conductive film in a photolithography step, the conductive film for forming the second electrode 109 and the oxide semiconductor film for forming the oxide semiconductor layer 107 are etched using the resist mask, whereby the second electrode 109 and the oxide semiconductor layer 107 are formed. Instead of the resist mask formed in the photolithography step, a resist mask is formed using an ink-jet method, so that the number of steps can be reduced. When the angle between the first electrode 105 and the end portions of the second electrode 109 and the oxide semiconductor layer 107 is 30° to 60° inclusive, preferably 40° to 50° inclusive by the etching, the coverage with the gate insulating film to be formed later can be improved, which is preferable.

Note that the etching of the conductive film and the oxide semiconductor film here may be performed using either dry etching or wet etching, or using both dry etching and wet etching. In order to form the oxide semiconductor layer 107 and the second electrode 109 each having a desired shape, an etching condition (etchant, etching time, temperature, or the like) is adjusted as appropriate in accordance with a material.

When the etching rate of each of the conductive film for forming the second electrode 109 and the oxide semiconductor film is different from that of the first electrode 105, a condition in which the etching rate of the first electrode 105 is low and the etching rate of each of the conductive film for forming the second electrode 109 and the oxide semiconductor film is high is selected. Alternatively, a condition in which the etching rate of the oxide semiconductor film is low and the etching rate of the conductive film for forming the second electrode 109 is high is selected, the conductive film for forming the second electrode 109 is etched; then, a condition in which the etching rate of the first electrode 105 is low and the etching rate of the oxide semiconductor film is high is selected.

As an etchant used for performing wet etching on the oxide semiconductor film, a solution obtained by mixing phosphoric acid, acetic acid, and nitric acid, an ammonia hydrogen peroxide (hydrogen peroxide at 31 wt %: ammonia water at 28 wt %: water=5:2:2, capacity ratio), or the like can be used. Alternatively, ITO-07N (manufactured by Kanto Chemical Co., Inc.) may be used.

The etchant after the wet etching is removed by cleaning together with the material etched off. The waste liquid containing the etchant and the material etched off may be purified and the material may be reused. When a material such as indium contained in the oxide semiconductor is collected from the waste liquid after the etching and reused, the resources can be efficiently used and the cost can be reduced.

As the etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride (CEO, sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

In this embodiment, the conductive film for forming the second electrode 109 is etched by a dry etching method, and then, the oxide semiconductor film is etched with a solution obtained by mixing phosphoric acid, acetic acid, and nitric acid to form the oxide semiconductor layer 107.

Next, in this embodiment, first heat treatment is performed. The first heat treatment is performed at a temperature of greater than or equal to 400° C. and less than or equal to 750° C., preferably, greater than or equal to 400° C. and less than a strain point of the substrate. Here, the substrate is introduced into an electric furnace which is one of heat treatment apparatuses, and heat treatment is performed on the oxide semiconductor film in an inert gas atmosphere, such as a nitrogen atmosphere or a rare gas atmosphere, at 450° C. for one hour, and then the oxide semiconductor film is not exposed to the air. Accordingly, hydrogen, water, a hydroxyl group, hydride, or the like can be prevented from entering the oxide semiconductor film, the hydrogen concentration is reduced, and the oxide semiconductor film is highly purified, whereby an i-type oxide semiconductor film or a substantially i-type oxide semiconductor film can be obtained. That is, at least one of dehydration and dehydrogenation of the oxide semiconductor layer 107 can be performed by this first heat treatment.

Note that it is preferable that in the first heat treatment, hydrogen, water, a hydroxyl group, hydride, or the like be not contained in nitrogen or a rare gas such as helium, neon, or argon. Alternatively, the purity of nitrogen or a rare gas such as helium, neon, or argon introduced into the heat treatment apparatus is greater than or equal to 6N (99.9999%), preferably greater than or equal to 7N (99.99999%) (that is, the impurity concentration is less than or equal to 1 ppm, preferably less than or equal to 0.1 ppm).

Depending on the conditions of the first heat treatment or a material of the oxide semiconductor film, the oxide semiconductor film is crystallized and changed to a microcrystalline film or a polycrystalline film in some cases. For example, the oxide semiconductor film may be crystallized to be a microcrystalline oxide semiconductor film in which the degree of crystallinity is greater than or equal to 90% or greater than or equal to 80%. Further, depending on the conditions of the first heat treatment and the material of the oxide semiconductor film, the oxide semiconductor film may become an amorphous oxide semiconductor film containing no crystalline component. The oxide semiconductor film may become an oxide semiconductor film in which a microcrystalline portion (with a grain diameter of 1 nm to 20 nm inclusive, typically 2 nm to 4 nm inclusive) is mixed in an amorphous oxide semiconductor film.

In addition, the first heat treatment of the oxide semiconductor film may be performed on the oxide semiconductor film before being processed into the island-shaped oxide semiconductor layer. In that case, the substrate is taken out of the heat treatment apparatus after the first heat treatment, and then a photolithography step is performed.

Note that the heat treatment which has an effect of dehydration or dehydrogenation on the oxide semiconductor film may be performed after the oxide semiconductor film is formed; after the conductive film to be the second electrode is stacked over the oxide semiconductor film; after the gate insulating film is formed over the first electrode, the oxide semiconductor film, and the second electrode; or after the gate electrode is formed.

Figure 12C:
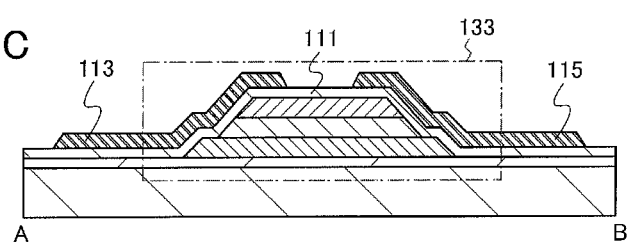

Next, as illustrated in FIG. 12C, the gate insulating film 111 is formed over the first electrode 105, the oxide semiconductor layer 107, and the second electrode 109.

The i-type oxide semiconductor film or the substantially i-type oxide semiconductor film (the highly purified oxide semiconductor film whose hydrogen concentration is reduced) obtained by the removal of impurities is extremely sensitive to an interface state and interface charge; therefore, the interface between the oxide semiconductor film and the gate insulating film 111 is important. Accordingly, the gate insulating film 111 which is in contact with the highly purified oxide semiconductor film needs high quality.

For example, a high-quality insulating film which is dense and has high withstand voltage can be formed by high density plasma CVD using microwaves (2.45 GHz), which is preferably used. This is because when the highly purified oxide semiconductor film whose hydrogen concentration is reduced and the high-quality gate insulating film are in close contact with each other, the interface state can be reduced and the interface characteristics can be favorable.

Needless to say, other film formation methods, such as a sputtering method or a plasma CVD method, can be applied as long as a high-quality insulating film can be formed as the gate insulating film. In addition, as the gate insulating film, an insulating film whose characteristics of an interface with the oxide semiconductor film are improved or whose film quality is improved by heat treatment after the formation may be used. In any case, an insulating film which can reduce the interface state density with the oxide semiconductor film and can form a favorable interface, in addition to having good film quality as the gate insulating film, may be used.

In a gate bias-temperature stress test (BT test) at 85° C. at $2 \times 10^6$ V/cm for 12 hours, when impurities are added to the oxide semiconductor film, bonds between impurities and a main component of the oxide semiconductor film are cut by an intense electric field (B: bias) and high temperature (T: temperature), and generated dangling bonds cause a shift in threshold voltage (Vth).

On the other hand, when impurities of the oxide semiconductor film, in particular, hydrogen, water, or the like, are removed as much as possible, and characteristics of an interface between the oxide semiconductor film and the gate insulating film are improved as described above, a thin film transistor which is stable with respect to the BT test can be obtained.

When the gate insulating film 111 is formed by a sputtering method, the hydrogen concentration in the gate insulating film 111 can be reduced. When a silicon oxide film is formed by a sputtering method, a silicon target or a quartz target is used as a target and oxygen or a mixed gas of oxygen and argon is used as a sputtering gas.

The gate insulating film 111 can have a structure in which a silicon oxide film and a silicon nitride film are stacked in that order over the first electrode 105, the oxide semiconductor layer 107, and the second electrode 109. For example, a silicon oxide film ($SiO_x$ (x>0)) having a thickness of 5 nm to 300 nm inclusive may be formed as a first gate insulating film, and a silicon nitride film ($SiN_y$ (y>0)) having a thickness of 50 nm to 200 nm inclusive may be stacked as a second gate insulating film over the first gate insulating film by a sputtering method, so that a gate insulating film having a thickness of 100 nm may be formed. In this embodiment, a silicon oxide film having a thickness of 100 nm is formed by an RF sputtering method under the following conditions: the pressure is 0.4 Pa, the electric power of high-frequency power source is 1.5 kW, and the atmosphere contains oxygen and argon (the flow ratio of oxygen to argon is 1:1 (each flow rate is 25 sccm)).

Next, second heat treatment may be performed in an inert gas atmosphere or an oxygen gas atmosphere (preferably, at a temperature of 200° C. to 400° C. inclusive, for example, a temperature of 250° C. to 350° C. inclusive). Note that the second heat treatment may be performed after the formation of any one of the third electrode 113, the third electrode 115, the insulating film 117, and the wiring 125, which is performed later. Hydrogen or moisture contained in the oxide semiconductor film can be diffused into the gate insulating film by the heat treatment.

Then, the third electrode 113 and the third electrode 115 serving as a gate electrode are formed over the gate insulating film 111.

The third electrode 113 and the third electrode 115 can be formed in such a way that a conductive film for forming the third electrode 113 and the third electrode 115 is formed over the gate insulating film 111 by a sputtering method, a CVD method, or a vacuum evaporation method, a resist mask is formed in a photolithography step over the conductive film, and the conductive film is etched using the resist mask. A material similar to that of the first electrode 105 can be used for the conductive film for forming the third electrode 113 and the third electrode 115.

In this embodiment, after a titanium film having a thickness of 150 nm is formed by a sputtering method, etching is performed using a resist mask formed in a photolithography step, so that the third electrode 113 and the third electrode 115 are formed.

Through the above process, the thin film transistor 133 having the highly purified oxide semiconductor layer 107 whose hydrogen concentration is reduced can be formed.

Figure 12D:
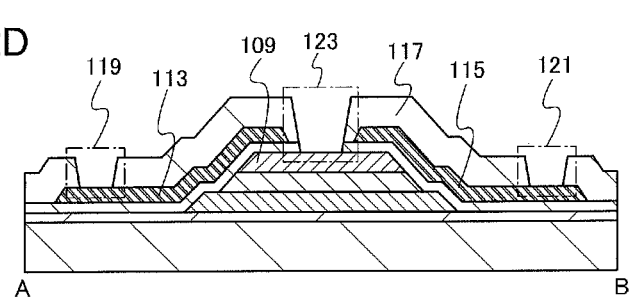

Next, as illustrated in FIG. 12D, after the insulating film 117 is formed over the gate insulating film 111, the third electrode 113, and the third electrode 115, contact holes 119, 121, and 123 are formed.

The insulating film 117 is formed using an oxide insulating film such as a silicon oxide film, a silicon oxynitride film, an aluminum oxide film, or an aluminum oxynitride film; or a nitride insulating film such as a silicon nitride film, a silicon nitride oxide film, an aluminum nitride film, or an aluminum nitride oxide film. Alternatively, an oxide insulating film and a nitride insulating film can be stacked.

The insulating film 117 is formed by a sputtering method, a CVD method, or the like. Note that when the insulating film 117 is formed by a sputtering method, the substrate 101 may be heated to a temperature of 100° C. to 400° C. inclusive, a high-purity sputtering gas which contains nitrogen, from which hydrogen, water, a hydroxyl group, hydride, or the like is removed may be introduced, and an insulating film may be formed using a silicon target. Also in this case, an insulating film is preferably formed while hydrogen, water, a hydroxyl group, hydride, or the like remaining in the treatment chamber is removed.

Note that after the insulating film 117 is formed, heat treatment may be performed in the air at a temperature of 100° C. to 200° C. inclusive for 1 hour to 30 hours inclusive. A normally-off thin film transistor can be obtained by this heat treatment. Therefore, reliability of the semiconductor device can be improved.

A resist mask is formed in a photolithography step, and parts of the gate insulating film 111 and the insulating film 117 are removed by selective etching, whereby the contact holes 123, 119, and 121 which reach the second electrode 109, the third electrode 113, and the third electrode 115 are formed.

Next, after a conductive film is formed over the gate insulating film 111, the insulating film 117, and the contact holes 119, 121, and 123, etching is performed using a resist mask formed in a photolithography step, whereby the wirings 125 and 131 (not illustrated in FIG. 12E) are formed. Note that a resist mask may be formed by an ink-jet method. No photomask is used when a resist mask is formed by an ink-jet method; therefore, production cost can be reduced.

The wirings 125 and 131 can be formed in a manner similar to that of the first electrode 105.

Note that a planarization insulating film for planarization may be provided between the third electrodes 113 and 115 and the wirings 125 and 131. An organic material having heat resistance, such as polyimide, an acrylic resin, a benzocyclobutene-based resin, polyamide, or an epoxy resin can be used as typical examples of the planarization insulating film. Other than such organic materials, it is also possible to use a low-dielectric constant material (a low-k material), a siloxane-based resin, phosphosilicate glass (PSG), borophosphosilicate glass (BPSG), or the like. Note that the planarization insulating film may be formed by stacking a plurality of insulating films formed from these materials.

Note that the siloxane-based resin corresponds to a resin containing a Si—O—Si bond formed using a siloxane-based material as a starting material. The siloxane-based resin may contain an organic group (e.g., an alkyl group or an aryl group) or a fluoro group as a substituent. Moreover, the organic group may contain a fluoro group.

There is no particular limitation on a method for forming the planarization insulating film. Depending on the material, the planarization insulating film can be formed by a method such as sputtering method, an SOG method, a spin coating method, a dipping method, a spray coating method, or a droplet discharge method (e.g., an ink-jet method, screen printing, or offset printing), or by using a tool (equipment) such as a doctor knife, a roll coater, a curtain coater, or a knife coater.

As described above, the hydrogen concentration in the oxide semiconductor film can be reduced, and the oxide semiconductor film can be highly purified. Accordingly, the oxide semiconductor film can be stabilized. In addition, an oxide semiconductor film which has an extremely small number of minority carriers and a wide band gap can be formed by heat treatment at a temperature of less than or equal to the glass transition temperature. Therefore, a thin film transistor can be formed using a large-area substrate; thus, the mass productivity can be improved. In addition, using the highly purified oxide semiconductor film whose hydrogen concentration is reduced makes it possible to manufacture a thin film transistor which is suitable for higher definition and has high operation speed and in which a large amount of current can flow in an on state and almost no current flows in an off state.

By electrically connecting one of a source electrode and a drain electrode of a thin film transistor to a gate electrode thereof as described above, a diode in which reverse current is very small can be obtained. Therefore, a diode which is resistant to a breakdown (i.e., has high withstand voltage) can be manufactured. In addition, a work function of a material used for a region which is in contact with an oxide semiconductor layer in one of a source electrode and a drain electrode electrically connected to a gate electrode is $\phi md$, a work function of a material used for a region of the other of the source electrode and the drain electrode which is in contact with the oxide semiconductor layer is $\phi ms$, and electron affinity of the oxide semiconductor layer is $\chi$. When $\phi md$, $\phi ms$, and $\chi$ satisfy a condition shown in Formula 2, a diode which has a more excellent rectification property and is resistant to a breakdown can be obtained.

Note that a halogen element (e.g. fluorine or chlorine) may be contained in an insulating film provided in contact with the oxide semiconductor film, or a halogen element may be contained in an oxide semiconductor film by plasma treatment in a gas atmosphere containing a halogen element in a state that the oxide semiconductor film is exposed, whereby impurities such as hydrogen, water, a hydroxyl group, or hydride (also referred to as hydrogen compound) existing in the oxide semiconductor film or at the interface between the oxide semiconductor film and the insulating film which is provided in contact with the oxide semiconductor film may be removed. When the insulating film contains a halogen element, the halogen element concentration in the insulating film may be approximately $5\times10^{18}$ atoms/cm$^3$ to $1\times10^{20}$ atoms/cm$^3$ inclusive.

As described above, in the case where a halogen element is contained in the oxide semiconductor film or at the interface between the oxide semiconductor film and the insulating film which is in contact with the oxide semiconductor film and the insulating film which is provided in contact with the oxide semiconductor film is an oxide insulating film, the side of the oxide insulating film which is not in contact with the oxide semiconductor film is preferably covered with a nitrogen-based insulating film. That is, a silicon nitride film or the like may be provided on and in contact with the oxide insulating film which is in contact with the oxide semiconductor film. With such a structure, impurities such as hydrogen, water, a hydroxyl group, or hydride can be prevented from entering the oxide insulating film.

The diodes which are illustrated in FIGS. 7A and 7B, FIGS. 8A and 8B, FIGS. 9A and 9B, FIGS. 10A and 10B, and FIGS. 11A and 11B can be formed in a manner similar to the above.

This embodiment can be implemented in appropriate combination with the structure described in any of other embodiments.

(Embodiment 7)

In this embodiment, a diode-connected thin film transistor which includes an oxide semiconductor film which is different from that in Embodiment 6 and a manufacturing method thereof will be described with reference to FIGS. 12A to 12E and FIGS. 13A and 13B.

In a manner similar to that in Embodiment 6, as illustrated in FIG. 12A, an insulating film 103 and a first electrode 105 are formed over a substrate 101. Next, as illustrated in FIG. 12B, an oxide semiconductor layer 107 and a second electrode 109 are formed over the first electrode 105.

Figure 13A:
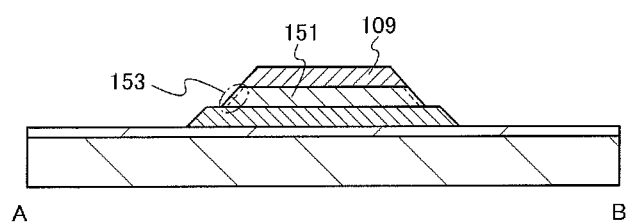
FIGS. 13A and 13B are cross-sectional views illustrating a method for manufacturing a diode according to an embodiment of the present invention.

Next, first heat treatment is performed. The first heat treatment in this embodiment is different from the first heat treatment in the above embodiment. The heat treatment makes it possible to form an oxide semiconductor layer 151 in which crystal grains are formed in the surface as illustrated in FIG. 13A. In this embodiment, the first heat treatment is performed with an apparatus for heating an object to be processed by at least one of thermal conduction and thermal radiation from a heater such as a resistance heater. Here, the temperature of the heat treatment is 500° C. to 700° C. inclusive, preferably 650° C. to 700° C. inclusive. Note that the upper limit of the heat treatment temperature needs to be within the allowable temperature limit of the substrate 101. In addition, the length of time of the heat treatment is preferably 1 minute to 10 minutes inclusive. When RTA treatment is employed for the first heat treatment, the heat treatment can be performed in a short time; thus, adverse effects of heat on the substrate 101 can be reduced. That is, the upper limit of the heat treatment temperature can be raised, compared to the case where heat treatment is performed for a long time. In addition, the crystal grains having predetermined structures can be selectively formed in the vicinity of the surface of the oxide semiconductor film.

As examples of the heat treatment apparatus that can be used in this embodiment, rapid thermal anneal (RTA) apparatuses such as a gas rapid thermal anneal (GRTA) apparatus and a lamp rapid thermal anneal (LRTA) apparatus, and the like are given. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas, e.g., argon is used.

For example, as the first heat treatment, GRTA may be performed as follows. The substrate is transferred and put in an inert gas atmosphere of nitrogen, a rare gas, or the like which has been heated to a high temperature of 650° C. to 700° C. inclusive, heated for several minutes, and transferred and taken out of the inert gas which has been heated to a high temperature. GRTA enables a high-temperature heat treatment for a short time.

Note that in the first heat treatment, it is preferable that hydrogen, water, a hydroxyl group, hydride, or the like be not contained in nitrogen or a rare gas such as helium, neon, or argon. Alternatively, the purity of nitrogen or a rare gas such as helium, neon, or argon that is introduced into the heat treatment apparatus is preferably greater than or equal to 6N (99.9999%), more preferably greater than or equal to 7N (99.99999%) (that is, the impurity concentration is less than or equal to 1 ppm, preferably less than or equal to 0.1 ppm).

Note that the above heat treatment may be performed at any timing as long as it is performed after the oxide semiconductor layer 107 is formed; however, in order to promote dehydration or dehydrogenation, the heat treatment is preferably performed before other components are formed on a surface of the oxide semiconductor layer 107. In addition, the heat treatment may be performed plural times instead of once.

Figure 13B:
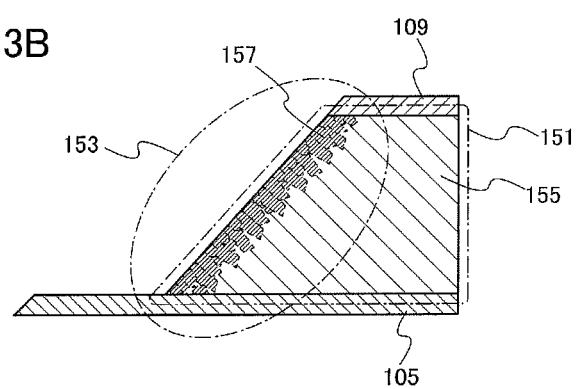

FIG. 13B is an enlarged view of a dashed line portion 153 in FIG. 13A.

The oxide semiconductor layer 151 includes an amorphous region 155 that mainly contains an amorphous oxide semiconductor and crystal grains 157 that are formed in the surface of the oxide semiconductor layer 151. Further, the crystal grains 157 are formed in a region that extends from the surface of the oxide semiconductor layer 151 to a depth of about 20 nm (i.e., in the vicinity of the surface). Note that the location where the crystal grains 157 are formed is not limited to the above in the case where the thickness of the oxide semiconductor layer 151 is large. For example, in the case where the oxide semiconductor layer 151 has a thickness of greater than or equal to 200 nm, the "vicinity of a surface (surface vicinity)" means a region that has a thickness (depth) from the surface, which is less than or equal to 10% of the thickness of the oxide semiconductor film.

Here, the amorphous region 155 mainly contains an amorphous oxide semiconductor film. Note that the word "mainly" means, for example, a state where one occupies 50% or more of a region. In this case, it means a state where the amorphous oxide semiconductor film occupies 50% or more of vol % (or wt %) of the amorphous region 155. That is, the amorphous region in some cases includes crystals of the oxide semiconductor film other than the amorphous oxide semiconductor film, and the percentage of the content thereof is preferably less than 50% of vol % (or wt %). However, the percentage of the content is not limited to the above.

In the case where an In—Ga—Zn—O-based oxide semiconductor film is used as a material for the oxide semiconductor film, the composition of the above amorphous region 155 is preferably set so that the Zn content (at. %) is less than the In or Ga content (at. %) for the reason that such a composition makes it easy for the crystal grains 157 which have a predetermined composition to be formed.

After that, a gate insulating film and a third electrode that serves as a gate electrode are formed in a manner similar to that of Embodiment 6 to complete the thin film transistor.

The vicinity of the surface of the oxide semiconductor layer 151, which is in contact with the gate insulating film, serves as a channel. The crystal grains are included in the region that serves as a channel, whereby the resistance between a source, the channel, and a drain is reduced and carrier mobility is increased. Thus, the field-effect mobility of the thin film transistor which includes the oxide semiconductor layer 151 is increased, which leads to favorable electric characteristics of the thin film transistor.

Further, the crystal grains 157 are more stable than the amorphous region 155; thus, when the crystal grains 157 are included in the vicinity of the surface of the oxide semiconductor layer 151, entry of impurities (e.g., hydrogen, water, a hydroxyl group, or hydride) into the amorphous region 155 can be reduced. Thus, the reliability of the oxide semiconductor layer 151 can be improved.

Through the above-described steps, the concentration of hydrogen in the oxide semiconductor film can be reduced and the oxide semiconductor film is highly purified. Thus, stabilization of the oxide semiconductor film can be achieved. In addition, heat treatment at a temperature of less than or equal to the glass transition temperature makes it possible to form an oxide semiconductor film with a wide band gap in which the number of minority carriers is extremely small. Thus, thin film transistors can be manufactured using a large substrate, which leads to enhancement of mass production. Further, the use of the oxide semiconductor film in which the hydrogen concentration is reduced and the purity is increased makes it possible to manufacture a thin film transistor which is suitable for increase in definition and has high operation speed and in which a large amount of current can flow in an on state and almost no current flows in an off state.

By electrically connecting one of a source electrode and a drain electrode of a thin film transistor to a gate electrode thereof as described above, a diode in which reverse current is very small can be obtained. Therefore, a diode which is resistant to a breakdown (i.e., has high withstand voltage) can be manufactured. In addition, a work function of a material used for a region which is in contact with an oxide semiconductor layer in one of a source electrode and a drain electrode electrically connected to a gate electrode is $\phi$md, a work function of a material used for a region of the other of the source electrode and the drain electrode which is in contact with the oxide semiconductor layer is $\phi$ms, and electron affinity of the oxide semiconductor layer is $\chi$. When $\phi$md, $\phi$ms, and $\chi$ satisfy a condition shown in Formula 2, a diode which has a more excellent rectification property and is resistant to a breakdown can be obtained.

This embodiment can be implemented in appropriate combination with the structure described in any of other embodiments.

(Embodiment 8)

In this embodiment, manufacturing steps of the diode-connected thin film transistor illustrated in FIGS. 6A and 6B, which are different from those in Embodiment 6, will be described with reference to FIGS. 12A to 12E.

In a manner similar to that of Embodiment 6, as illustrated in FIG. 12A, the first electrode 105 is formed over the substrate 101.

Next, as illustrated in FIG. 12B, the oxide semiconductor layer 107 and the second electrode 109 are formed over the first electrode 105.

In this embodiment, the oxide semiconductor film is formed by a sputtering method using an In—Ga—Zn—O-based metal oxide target. In this embodiment, the substrate is held in a treatment chamber which is maintained in a reduced pressure state, and the substrate is heated to room temperature or a temperature of less than 400° C. Then, the oxide semiconductor film is formed over the substrate 101 and the first electrode 105 in such a manner that a sputtering gas from which hydrogen, water, a hydroxyl group, hydride, or the like is removed is introduced and the metal oxide is used as a target while hydrogen, water, a hydroxyl group, hydride, or the like remaining in the treatment chamber is removed. An entrapment vacuum pump is preferably used for removing hydrogen, water, a hydroxyl group, hydride, or the like remaining in the treatment chamber. For example, a cryopump, an ion pump, or a titanium sublimation pump is preferably used. An evacuation unit may be a turbo pump provided with a cold trap. In the treatment chamber evacuated with a cryopump, for example, hydrogen, water, a hydroxyl group, hydride (more preferably a compound containing a carbon atom), or the like is removed; thus, the concentration of impurities contained in the oxide semiconductor film formed in the treatment chamber can be reduced. Further, sputtering formation is performed while hydrogen, water, a hydroxyl group, hydride, or the like remaining in the treatment chamber is removed with a cryopump, whereby an oxide semiconductor film in which impurities such as hydrogen atoms and water are reduced can be formed even at a substrate temperature of room temperature to a temperature of less than 400° C.

In this embodiment, as the deposition condition, the distance between the substrate and the target is 100 mm, the pressure is 0.6 Pa, the electric power of the direct current (DC) power source is 0.5 kW, and the atmosphere is an oxygen atmosphere (the proportion of the oxygen flow rate is 100%). Note that a pulse direct current (DC) power source is preferable because powder substances (also referred to as particles or dust) generated in film formation can be reduced and the film thickness can be uniform. The oxide semiconductor film preferably has a thickness of 30 nm to 3000 nm inclusive. Note that an appropriate thickness differs depending on an oxide semiconductor material which is used, and the thickness may be set as appropriate depending on the material.

Note that the sputtering method that is used for forming the insulating film 103 can be used as appropriate as a sputtering method for forming the oxide semiconductor film.

Then, a conductive film for forming the second electrode 109 is formed in a manner similar to that in Embodiment 6.

Next, in a manner similar to that of Embodiment 6, the conductive film for forming the second electrode 109 and the oxide semiconductor film for forming the oxide semiconductor layer 107 are etched so that the second electrode 109 and the oxide semiconductor layer 107 are formed. The etching conditions (such as an etchant, etching time, and temperature) are adjusted as appropriate in accordance with the material in order to form the oxide semiconductor layer 107 and the second electrode 109 with desired shapes.

Next, as illustrated in FIG. 12C, in a manner similar to that of Embodiment 6, the gate insulating film 111 is formed over the first electrode 105, the oxide semiconductor layer 107, and the second electrode 109. As the gate insulating film 111, a gate insulating film that has a favorable characteristic of an interface between the gate insulating film 111 and the oxide semiconductor layer 107 is preferable. The gate insulating film 111 is preferably formed by high-density plasma CVD using a microwave (2.45 GHz), in which case the gate insulating film 111 can be dense and can have high withstand voltage and high quality. Another method such as a sputtering method or a plasma CVD method can be employed as long as the method enables a good-quality insulating film to be formed as the gate insulating film.

Further, before the gate insulating film 111 is formed, hydrogen, water, a hydroxyl group, hydride, or the like attached to an exposed surface of the oxide semiconductor film may be removed by plasma treatment using a gas such as $N_2O$, $N_2$, or Ar. In addition, plasma treatment may be performed using a mixed gas of oxygen and argon. In the case where plasma treatment is performed, the gate insulating film 111 which is to be in contact with part of the oxide semiconductor film is preferably formed without being exposed to the air.

Further, it is preferable that the substrate 101 over which components including the first electrode 105 to the second electrode 109 are formed be preheated in a preheating chamber in a sputtering apparatus as pretreatment to eliminate and remove impurities such as hydrogen, water, a hydroxyl group, hydride, or the like attached to the substrate 101 so that hydrogen, water, a hydroxyl group, hydride, or the like is contained as little as possible in the gate insulating film 111. Alternatively, it is preferable that the substrate 101 be preheated in a preheating chamber in a sputtering apparatus to eliminate and remove impurities such as hydrogen, water, a hydroxyl group, hydride, or the like attached to the substrate 101 after the gate insulating film 111 is formed. Note that the temperature of the preheating is 100° C. to 400° C. inclusive, preferably 150° C. to 300° C. inclusive. A cryopump is preferable as an evacuation unit provided in the preheating chamber. Note that this preheating treatment can be omitted.

The gate insulating film 111 can have a structure in which a silicon oxide film and a silicon nitride film are stacked in that order over the first electrode 105, the oxide semiconductor layer 107, and the second electrode 109. For example, a silicon oxide film ($SiO_x$ (x>0)) with a thickness of 5 nm to 300 nm inclusive is formed as a first gate insulating film by a sputtering method and a silicon nitride film ($SiN_y$ (y>0)) with a thickness of 50 nm to 200 nm inclusive is stacked as a second gate insulating film over the first gate insulating film, whereby the gate insulating film 111 is formed.

Next, as illustrated in FIG. 12C, in a manner similar to that of Embodiment 6, the third electrodes 113 and 115 that serve as a gate electrode are formed over the gate insulating film 111.

Through the above-described steps, the thin film transistor 133 which includes the oxide semiconductor layer 107 in which the hydrogen concentration is reduced can be manufactured.

Hydrogen, water, a hydroxyl group, hydride, or the like remaining in a reaction atmosphere is removed in forming the oxide semiconductor film as described above, whereby the concentration of hydrogen in the oxide semiconductor film can be reduced. Thus, stabilization of the oxide semiconductor film can be achieved.

Next, as illustrated in FIG. 12D, in a manner similar to that of Embodiment 6, the contact holes 119, 121, and 123 are formed after the insulating film 117 is formed over the gate insulating film 111 and the third electrodes 113 and 115.

Figure 12E:
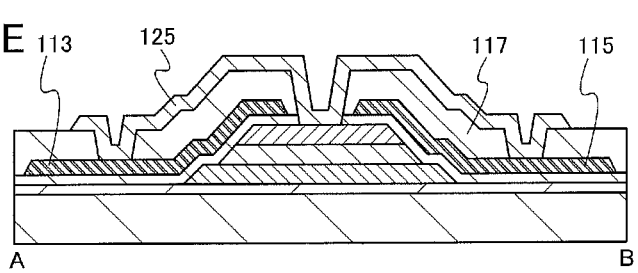

Next, as illustrated in FIG. 12E, in a manner similar to that of Embodiment 6, the wiring 125 is formed.

Note that in a manner similar to that of Embodiment 6, after the formation of the insulating film 117, heat treatment may be further performed at a temperature of 100° C. to 200° C. inclusive in the air for 1 hour to 30 hours inclusive. This heat treatment enables a normally-off thin film transistor to be obtained. Thus, the reliability of a semiconductor device can be improved.

Note that a planarization insulating film for planarization may be provided between the third electrodes 113 and 115 and the wiring 125.

Hydrogen, water, a hydroxyl group, hydride, or the like remaining in a reaction atmosphere is removed in forming the oxide semiconductor film as described above, whereby the concentration of hydrogen in the oxide semiconductor film can be reduced and the purity of the oxide semiconductor film can be increased. Thus, stabilization of the oxide semiconductor film can be achieved. In addition, heat treatment at a temperature of less than or equal to the glass transition temperature makes it possible to form an oxide semiconductor film with a wide band gap in which the number of minority carriers is extremely small. Thus, thin film transistors can be manufactured using a large substrate, which leads to enhancement of mass production. Further, the use of the oxide semiconductor film in which the hydrogen concentration is reduced and the purity is increased makes it possible to manufacture a thin film transistor which is suitable for increase in definition and has high operation speed and in which a large amount of current can flow in an on state and almost no current flows in an off state.

By electrically connecting one of a source electrode and a drain electrode of a thin film transistor to a gate electrode thereof as described above, a diode in which reverse current is very small can be obtained. Therefore, a diode which is resistant to a breakdown (i.e., has high withstand voltage) can be manufactured. In addition, a work function of a material used for a region which is in contact with an oxide semiconductor layer in one of a source electrode and a drain electrode electrically connected to a gate electrode is $\phi md$, a work function of a material used for a region of the other of the source electrode and the drain electrode which is in contact with the oxide semiconductor layer is $\phi ms$, and electron affinity of the oxide semiconductor layer is $\chi$. When $\phi md$, $\phi ms$, and $\chi$ satisfy a condition shown in Formula 2, a diode which has a more excellent rectification property and is resistant to a breakdown can be obtained.

This embodiment can be implemented in appropriate combination with the structure described in any of other embodiments.

(Embodiment 9)

The non-linear element such as the diode which is described in the above embodiment can be applied to a semiconductor device. As the semiconductor device, for example, a display device can be given.

Figure 14:
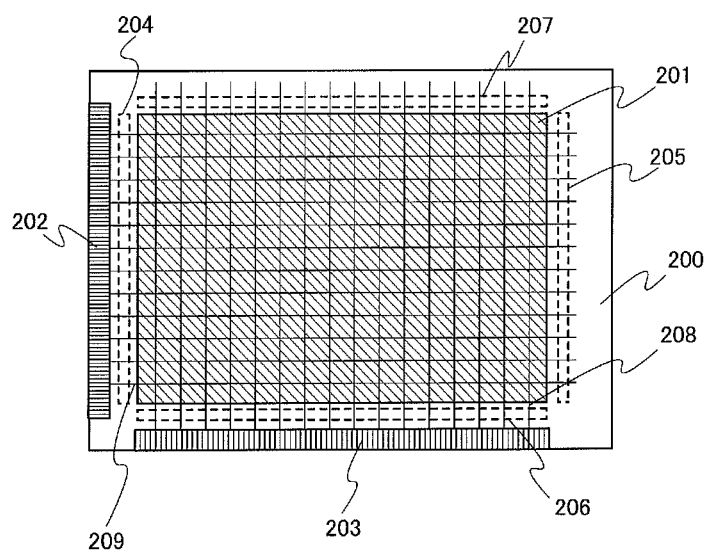
FIG. 14 is a diagram illustrating a display device according to an embodiment of the present invention.

The structure of a display device according to an embodiment of the present invention will be described with reference to FIG. 14. FIG. 14 is a top view of a substrate 200 of the display device. A pixel portion 201 is formed over the substrate 200. In addition, an input terminal 202 and an input terminal 203 supply a signal and power for displaying images to a pixel circuit formed over the substrate 200.

Note that the display device according to an embodiment of the present invention is not limited to that illustrated in FIG. 14. That is, one of or both a scan line driver circuit and a signal line driver circuit may be formed over the substrate 200.

The input terminal 202 on the scan line side and the input terminal 203 on the signal line side which are formed over the substrate 200 are connected to the pixel portion 201 by wirings extended vertically and horizontally. The wirings are connected to protection circuits 204 to 207.

The pixel portion 201 and the input terminal 202 are connected by a wiring 209. The protection circuit 204 is placed between the pixel portion 201 and the input terminal 202 and is connected to the wiring 209. When the protection circuit 204 is provided, various semiconductor elements such as thin film transistors, which are included in the pixel portion 201, can be protected and deterioration or damage thereof can be prevented. Note that although the wiring 209 corresponds to one wiring in the drawing, all of wirings of a plurality of wirings provided in parallel with the wiring 209 have connection relations which are similar to that of the wiring 209. Note that the wiring 209 serves as a scan line.

Note that on the scan line side, not only the protection circuit 204 between the input terminal 202 and the pixel portion 201 but also a protection circuit on the side of the pixel portion 201 which is opposite to the input terminal 202 may be provided (see the protection circuit 205 in FIG. 14).

Meanwhile, the pixel portion 201 and the input terminal 203 are connected by a wiring 208. The protection circuit 206 is placed between the pixel portion 201 and the input terminal 203 and is connected to the wiring 208. When the protection circuit 206 is provided, various semiconductor elements such as thin film transistors, which are included in the pixel portion 201, can be protected and deterioration or damage thereof can be prevented. Note that although the wiring 208 corresponds to one wiring in the drawing, all of wirings of a plurality of wirings provided in parallel with the wiring 208 have connection relations which are similar to that of the wiring 208. Note that the wiring 208 serves as a signal line.

Note that on the signal line side, not only the protection circuit 206 between the input terminal 203 and the pixel portion 201 but also a protection circuit on the side of the pixel portion 201 which is opposite to the input terminal 203 may be provided (see the protection circuit 207 in FIG. 14).

Note that all the protection circuits 204 to 207 are not necessarily provided. However, it is necessary to provide at least the protection circuit 204. This is because when excessive current is generated in the scan line, gate insulating layers of the thin film transistors included in the pixel portion 201 are broken and a number of point defects can be generated in some cases.

In addition, when not only the protection circuit 204 but also the protection circuit 206 is provided, generation of excessive current in the signal line can be prevented. Therefore, compared to the case where only the protection circuit 204 is provided, reliability is improved and yield is improved. When the protection circuit 206 is provided, breakdown due to static electricity which can be generated in a rubbing process or the like after forming the thin film transistors can be prevented.

Further, when the protection circuit 205 and the protection circuit 207 are provided, reliability can be further improved. Moreover, yield can be improved. The protection circuit 205 and the protection circuit 207 are provided opposite to the input terminal 202 and the input terminal 203, respectively. Therefore, the protection circuit 205 and the protection circuit 207 can prevent deterioration and breakdown of various semiconductor elements, which are caused in a manufacturing step of the display device (e.g., a rubbing process in manufacturing a liquid crystal display device).

Note that in FIG. 14, a signal line driver circuit and a scan line driver circuit which are formed separately from the substrate 200 are mounted on the substrate 200 by a known method such as a COG method or a TAB method. However, the present invention is not limited thereto. The scan line driver circuit and the pixel portion may be formed over the substrate 200, and the signal line driver circuit which is formed separately may be mounted. Alternatively, part of the scan line driver circuit or part of the signal line driver circuit, and the pixel portion 201 may be formed over the substrate 200, and the other part of the scan line driver circuit or the other part of the signal line driver circuit may be mounted. When part of the scan line driver circuit is provided between the pixel portion 201 and the input terminal 202 on the scan line side, a protection circuit may be provided between the input terminal 202 on the scan line side and part of the scan line driver circuit over the substrate 200; a protection circuit may be provided between part of the scan line driver circuit and the pixel portion 201; or protection circuits may be provided between the input terminal 202 on the scan line side and part of the scan line driver circuit over the substrate 200 and between part of the scan line driver circuit and the pixel portion 201. Alternatively, when part of the signal line driver circuit is provided between the pixel portion 201 and the input terminal 203 on the signal line side, a protection circuit may be provided between the input terminal 203 on the signal line side and part of the signal line driver circuit over the substrate 200; a protection circuit may be provided between part of the signal line driver circuit and the pixel portion 201; or protection circuits may be provided between the input terminal 203 on the signal line side and part of the signal line driver circuit over the substrate 200 and between part of the signal line driver circuit and the pixel portion 201. That is, since various modes are used for driver circuits, the number and the positions of protection circuits are determined in accordance with the modes of the driver circuits.

Next, examples of a specific circuit configuration of a protection circuit which is used as the protection circuits 204 to 207 in FIG. 14 are described with reference to FIGS. 15A to 15F. Only the case where an n-channel transistor is provided is described below.

Figure 15A:
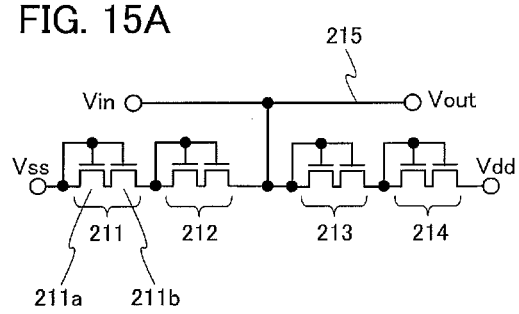
FIGS. 15A to 15F are diagrams each illustrating a protection circuit provided in a display device according to an embodiment of the present invention.

A protection circuit illustrated in FIG. 15A includes protection diodes 211 to 214 each including a plurality of thin film transistors. The protection diode 211 includes an n-channel thin film transistor 211a and an n-channel thin film transistor 211b which are connected in series. One of a source electrode and a drain electrode of the n-channel thin film transistor 211a is connected to a gate electrode of the n-channel thin film transistor 211a and a gate electrode of the n-channel thin film transistor 211b and is kept at an electric potential $V_{ss}$. The other of the source electrode and the drain electrode of the n-channel thin film transistor 211a is connected to one of a source electrode and a drain electrode of the n-channel thin film transistor 211b. The other of the source electrode and the drain electrode of the n-channel thin film transistor 211b is connected to the protection diode 212. Further, in a manner similar to that of the protection diode 211, the protection diodes 212 to 214 each include a plurality of thin film transistors connected in series, and one end of the plurality of thin film transistors connected in series is connected to gate electrodes of the plurality of thin film transistors.

Note that the number and the polarity of the thin film transistors included in the protection diodes 211 to 214 are not limited to those illustrated in FIG. 15A. For example, the protection diode 211 may be formed using three thin film transistors connected in series.

The protection diodes 211 to 214 are sequentially connected in series, and a wiring 215 is connected between the protection diode 212 and the protection diode 213. Note that the wiring 215 is a wiring electrically connected to a semiconductor element which is to be protected. Note that a wiring connected to the wiring 215 is not limited to a wiring between the protection diode 212 and the protection diode 213. That is, the wiring 215 may be connected between the protection diode 211 and the protection diode 212, or may be connected between the protection diode 213 and the protection diode 214.

One end of the protection diode 214 is kept at a power supply electric potential $V_{dd}$. In addition, each of the protection diodes 211 to 214 is connected so that reverse bias voltage is applied to each of the protection diodes 211 to 214.

Figure 15B:
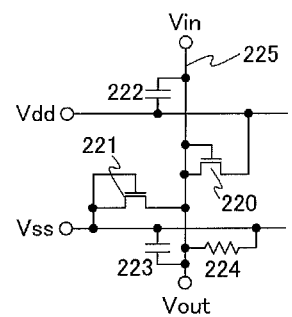

A protection circuit illustrated in FIG. 15B includes a protection diode 220, a protection diode 221, a capacitor 222, a capacitor 223, and a resistor 224. The resistor 224 is a resistor having two terminals. An electric potential $V_{in}$ is supplied to one of the terminals of the resistor 224 from a wiring 225. The electric potential $V_{ss}$ is supplied to the other of the terminals of the resistor 224. The resistor 224 is provided in order to make the electric potential of the wiring 225 $V_{ss}$ when the electric potential $V_{in}$ is not supplied, and the resistance value of the resistor 224 is set so as to be sufficiently larger than the wiring resistance of the wiring 225. Diode-connected n-channel thin film transistors are used for the protection diode 220 and the protection diode 221.

Note that for the protection diodes illustrated in FIGS. 15A to 15F, two or more thin film transistors may be connected in series.

Here, the case where the protection circuits illustrated in FIGS. 15A to 15F are operated is described. At this time, in each of the protection diodes 211, 212, 221, 230, 231, 234, and 235, one of a source electrode and a drain electrode which is kept at the electric potential $V_{ss}$ is a drain electrode, and the other is a source electrode. In each of the protection diodes 213, 214, 220, 232, 233, 236, and 237, one of a source electrode and a drain electrode which is kept at the electric potential $V_{dd}$ is a source electrode, and the other is a drain electrode. In addition, the threshold voltage of the thin film transistors included in the protection diodes is denoted by $V_{th}$.

Further, as for the protection diodes 211, 212, 221, 230, 231, 234, and 235, when the electric potential $V_{in}$ is higher than the electric potential $V_{ss}$, reverse bias voltage is applied thereto and current does not easily flow therethrough. Meanwhile, as for the protection diodes 213, 214, 220, 232, 233, 236, and 237, when the electric potential $V_{in}$ is lower than the electric potential $V_{dd}$, reverse bias voltage is applied thereto and current does not easily flow therethrough.

Here, operations of the protection circuits in which an electric potential $V_{out}$ has a value substantially between the electric potential $V_{ss}$ and the electric potential $V_{dd}$ are described.

First, the case where the electric potential $V_{in}$ is higher than the electric potential $V_{dd}$ is described. When the electric potential $V_{in}$ is higher than the electric potential $V_{dd}$, the n-channel thin film transistors are turned on when an electric potential difference between the gate electrodes and the source electrodes of the protection diodes 213, 214, 220, 232, 233, 236, and 237 is $V_{gs}=V_{in}-V_{dd}>V_{th}$. Here, since the case where $V_{in}$ is unusually high is assumed, the n-channel thin film transistors are turned on. At this time, the n-channel thin film transistors included in the protection diodes 211, 212, 221, 230, 231, 234, and 235 are turned off. Then, the electric potentials of the wirings 215, 225, 239A, and 239B become $V_{dd}$ through the protection diodes 213, 214, 220, 232, 233, 236, and 237. Therefore, even when the electric potential $V_{in}$ is unusually higher than the electric potential $V_{dd}$ due to noise or the like, the electric potentials of the wirings 215, 224, 225, 239A, and 239B do not become higher than the electric potential Via.

On the other hand, when the electric potential $V_{in}$ is lower than the electric potential $V_{ss}$ and an electric potential difference between the gate electrodes and the source electrodes of the protection diodes 211, 212, 221, 230, 231, 234, and 235 is $V_{gs}=V_{ss}-V_{in}>V_{th}$, the n-channel thin film transistors are turned on. Here, since the case where $V_{in}$ is unusually low is assumed, the n-channel thin film transistors are turned on. At this time, the n-channel thin film transistors included in the protection diodes 213, 214, 220, 232, 233, 236, and 237 are turned off. Then, the electric potentials of the wirings 215, 225, 239A, and 239B become $V_{ss}$ through the protection diodes 211, 212, 221, 230, 231, 234, and 235. Therefore, even when the electric potential $V_{in}$ is unusually lower than the electric potential $V_{ss}$ due to noise or the like, the electric potentials of the wirings 215, 225, 239A, and 239B do not become lower than the electric potential $V_{ss}$. Further, the capacitor 222 and the capacitor 223 reduce pulsed noise of the input electric potential $V_{in}$ and relieve a steep change in electric potential due to noise.

Note that when the electric potential $V_{in}$ has a value between $V_{ss}-V_{th}$ and $V_{dd}+V_{th}$, all the n-channel thin film transistors included in the protection diodes are turned off, and the electric potential $V_{in}$ is input to the electric potential $V_{out}$.

When the protection circuits are provided as described above, the electric potentials of the wirings 215, 225, 239A, and 239B are each kept to a value substantially between the electric potential $V_{ss}$ and the electric potential $V_{dd}$. Therefore, the electric potentials of the wirings 215, 225, 239A, and 239B can be prevented from deviating from this range greatly. That is, the electric potentials of the wirings 215, 225, 239A, and 239B can be prevented from being unusually high or being unusually low, a circuit in the subsequent stage of the protection circuits can be prevented from being damaged or deteriorating, and the circuit in the subsequent stage can be protected.

Further, as illustrated in FIG. 15B, when the protection circuit including the resistor 224 is provided for an input terminal, electric potentials of all the wirings to which a signal is input can be kept constant (here the electric potential $V_{ss}$) when a signal is not input. That is, when a signal is not input, the protection circuit also has a function of a short-circuit ring capable of short-circuiting the wirings. Therefore, electrostatic breakdown caused by an electric potential difference between the wirings can be prevented. In addition, since the resistance of the resistor 224 is sufficiently larger than wiring resistance, a signal input to the wiring can be prevented from dropping to the electric potential $V_{ss}$ at the time of inputting the signal.

Here, as an example, the case is described in which n-channel thin film transistors having the threshold voltage $V_{th}=0$ are used for the protection diode 220 and the protection diode 221 in FIG. 15B.

First, in the case of $V_{in}>V_{dd}$, the protection diode 220 is turned on because $V_{gs}=V_{in}-V_{dd}>0$. The n-channel thin film transistor included in the protection diode 221 is turned off. Therefore, the electric potential of the wiring 225 becomes $V_{dd}$, so that $V_{out}=V_{dd}$.

On the other hand, in the case of $V_{in}<V_{ss}$, the n-channel thin film transistor included in the protection diode 220 is turned off. The n-channel thin film transistor included in the protection diode 221 is turned on because $V_{gs}=V_{ss}-V_{in}>0$. Therefore, the electric potential of the wiring 225 becomes $V_{ss}$, so that $V_{out}=V_{ss}$.

Even in the case of $V_{in}<V_{ss}$ or $V_{dd}<V_{in}$ in this manner, operations can be performed in a range of $V_{ss}<V_{out}<V_{dd}$. Therefore, even in the case where $V_{in}$ is too high or too low, $V_{out}$ can be prevented from being too high or too tow. Accordingly, for example, even when the electric potential $V_{in}$ is lower than the electric potential $V_{ss}$ due to noise or the like, the electric potential of the wiring 225 does not become extremely lower than the electric potential $V_{ss}$. Further, the capacitor 222 and the capacitor 223 reduce pulsed noise of the input electric potential $V_{in}$ and relieve a steep change in electric potential.

When the protection circuit is provided as described above, the electric potential of the wiring 225 is kept to a value substantially between the electric potential $V_{ss}$ and the electric potential $V_{dd}$. Therefore, the electric potential of the wiring 225 can be prevented from deviating from this range greatly, and a circuit in the subsequent stage of the protection circuit (a circuit, an input portion of which is electrically connected to $V_{out}$) can be protected from being broken or deteriorating. Further, when a protection circuit is provided for an input terminal, electric potentials of all the wirings to which a signal is input can be kept constant (here the electric potential $V_{ss}$) when a signal is not input. That is, when a signal is not input, the protection circuit also has a function of a short-circuit ring capable of short-circuiting the wirings. Therefore, electrostatic breakdown caused by an electric potential difference between the wirings can be prevented. In addition, since the resistance value of the resistor 224 is sufficiently large, decrease in electric potential of a signal input to the wiring 225 can be prevented at the time of inputting the signal.

Figure 15C:
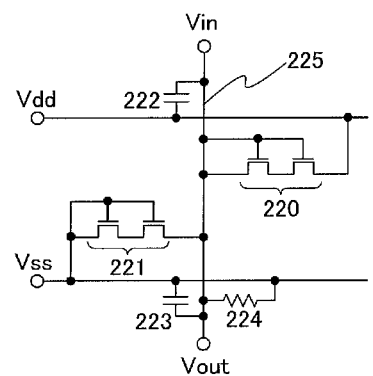

The protection circuit illustrated in FIG. 15C is a protection circuit in which two n-channel thin film transistors are used for each of the protection diode 220 and the protection diode 221.

Note that although diode-connected n-channel thin film transistors are used for the protection diodes in the protection circuits illustrated in FIGS. 15B and 15C, the present invention is not limited to this structure.

Figure 15D:
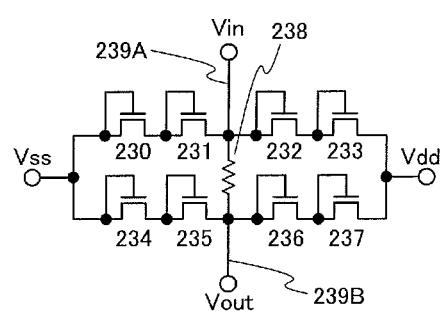

The protection circuit illustrated in FIG. 15D includes protection diodes 230 to 237 and a resistor 238. The resistor 238 is connected between a wiring 239A and a wiring 239B in series. A diode-connected n-channel thin film transistor is used for each of the protection diodes 230 to 233. In addition, a diode-connected n-channel thin film transistor is used for each of the protection diodes 234 to 237.

The protection diode 230 and the protection diode 231 are connected in series, one end thereof is kept at the electric potential $V_{ss}$, and the other end thereof is connected to the wiring 239A of the electric potential $V_{in}$. The protection diode 232 and the protection diode 233 are connected in series, one end thereof is kept at the electric potential $V_{dd}$, and the other end thereof is connected to the wiring 239A of the electric potential $V_{in}$. The protection diode 234 and the protection diode 235 are connected in series, one end thereof is kept at the electric potential $V_{ss}$, and the other end thereof is connected to the wiring 239B of the electric potential $V_{out}$. The protection diode 236 and the protection diode 237 are connected in series, one end thereof is kept at the electric potential $V_{dd}$, and the other end thereof is connected to the wiring 239B of the electric potential $V_{out}$.

Figure 15E:
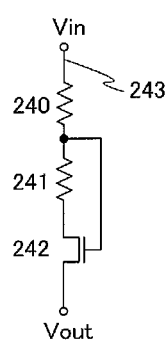

The protection circuit illustrated in FIG. 15E includes a resistor 240, a resistor 241, and a protection diode 242. Although a diode-connected n-channel thin film transistor is used for the protection diode 242 in FIG. 15E, the present invention is not limited to this structure. A plurality of diode-connected thin film transistors may be used. The resistor 240, the resistor 241, and the protection diode 242 are connected to a wiring 243 in series.

The resistor 240 and the resistor 241 can relieve a steep change in the electric potential of the wiring 243 and can prevent deterioration or breakdown of a semiconductor element. Further, the protection diode 242 can prevent reverse bias current from flowing through the wiring 243 due to the change in electric potential.

Figure 15F:
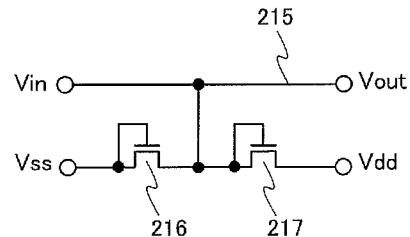

Note that the protection circuit illustrated in FIG. 15A can be replaced with a structure illustrated in FIG. 15F. FIG. 15F illustrates a structure in which the protection diode 211 and the protection diode 212 in FIG. 15A are replaced with the protection diode 216, and the protection diode 213 and the protection diode 214 are replaced with the protection diode 217. In particular, since the diode which is described in the above embodiment has high withstand voltage, the structure as illustrated in FIG. 15F can be used.

Note that when only the resistors are connected to the wiring in series, a steep change in the electric potential of the wiring can be relieved, and deterioration or breakdown of a semiconductor element can be prevented. Further, when only the protection diodes are connected to the wiring in series, reverse current can be prevented from flowing through the wiring due to the change in electric potential.

Note that the protection circuit provided in the display device according to an embodiment of the present invention is not limited to the structures illustrated in FIGS. 15A to 15F, and design of the protection circuit can be changed as appropriate as long as the protection circuit has a circuit configuration having a similar function.

(Embodiment 10)

The display device including the protection circuit described in Embodiment 9 can be applied to an electronic device.

As examples of the electronic device in which the display device of Embodiment 9 is applied to a display portion, the following can be given: cameras such as video cameras and digital cameras, goggle type displays, navigation systems, audio replay devices (e.g., car audio systems and audio systems), computers, game machines, portable information terminals (e.g., mobile computers, mobile phones, portable game machines, and electronic book readers), image replay devices in which a recording medium is provided (specifically, devices that are capable of replaying recording media such as digital versatile discs (DVDs) and equipped with a display that can display an image), and the like.

Figure 16A:
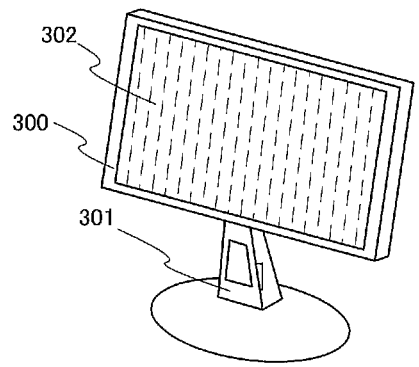
FIGS. 16A to 16C are diagrams each illustrating an electronic device according to an embodiment of the present invention.

A display illustrated in FIG. 16A includes a housing 300, a support 301, and a display portion 302, and has a function of displaying a variety of input information (e.g., still images, moving images, and text images) on the display portion 302. Note that the function included in the display illustrated in FIG. 16A is not limited to this, and for example, the display can be provided with a speaker, or the display may be a touch panel through which information can be not only displayed but input.

Figure 16B:
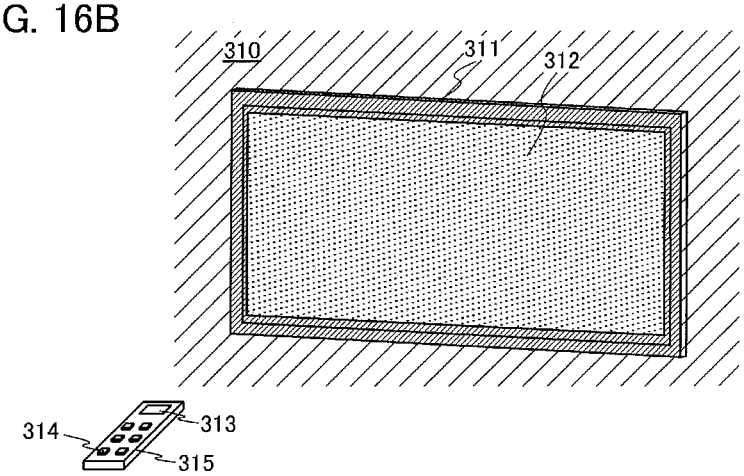

In a television set illustrated in FIG. 16B, a display portion 312 is incorporated in a housing 311. The display portion 312 can display images. Here, the structure in which the rear side of the housing is supported by fixing to a wall 310 is shown.

The television set illustrated in FIG. 16B can be operated with an operation switch of the housing 311 or a remote controller 315. Channels and volume can be controlled by an operation key 314 of the remote controller 315 so that an image displayed on the display portion 312 can be controlled. Further, the remote controller 315 may be provided with a display portion 313 for displaying data output from the remote controller 315.

Note that the television set illustrated in FIG. 16B may be provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Figure 16C:
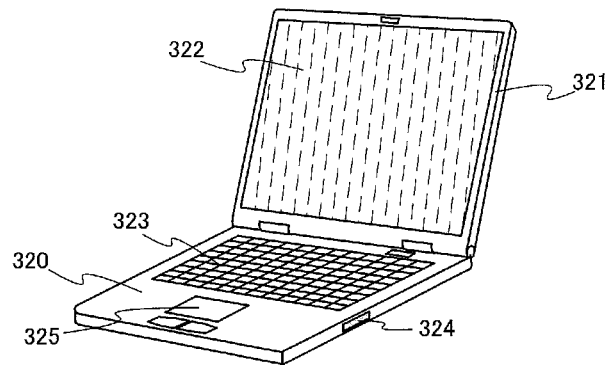

A computer illustrated in FIG. 16C includes a main body 320, a housing 321, a display portion 322, a keyboard 323, an external connection port 324, and a pointing device 325, and has a function of displaying a variety of information (e.g., still images, moving images, and text images) on the display portion 322. Note that the function of the computer illustrated in FIG. 16C is not limited to this function, and for example, may include a function of a touch panel capable of inputting information as well as displaying information.

As described in this embodiment, a non-linear element such as a diode according to an embodiment of the present invention can be applied to an electronic device.

This application is based on Japanese Patent Application serial no. 2009-251503 filed with Japan Patent Office on Oct. 30, 2009, the entire contents of which are hereby incorporated by reference.

The invention claimed is:

1. A non-linear element comprising:
a first electrode formed over a substrate;
an oxide semiconductor layer formed on and in contact with the first electrode, in which a hydrogen concentration is less than or equal to $5\times10^{19}$ /cm$^3$; and
a second electrode formed on and in contact with the oxide semiconductor layer,
wherein a work function φma of the first electrode, electron affinity χ of the oxide semiconductor layer, and a work function φmc of the second electrode satisfy φmc ≦χ<φma.

2. The non-linear element according to claim 1, wherein a material of the first electrode is tungsten, molybdenum, chromium, iron, or indium tin oxide.

3. The non-linear element according to claim 1, wherein a material of the second electrode is titanium, yttrium, aluminum, magnesium, silver, or zirconium.

4. The non-linear element according to claim 1, wherein a difference between the work function φma of the first electrode and the electron affinity χ of the oxide semiconductor layer is greater than or equal to 0.2 eV.

5. The non-linear element according to claim 1, wherein a carrier concentration of the oxide semiconductor layer is less than or equal to $5\times10^{14}$ /cm$^3$.

6. The non-linear element according to claim 1, further comprising an insulating film covering the first electrode, the oxide semiconductor layer, and the second electrode.

7. A display device comprising a protection circuit including the non-linear element according to claim 1.

8. An electronic device comprising the display device according to claim 7.

9. A non-linear element comprising:
a first electrode formed over a substrate;
an oxide semiconductor layer formed on and in contact with the first electrode, in which a hydrogen concentration is less than or equal to $5\times10^{19}$ /cm$^3$;
a second electrode formed on and in contact with the oxide semiconductor layer;
an insulating film covering the first electrode, the oxide semiconductor layer, and the second electrode; and
a plurality of third electrodes formed in contact with the insulating film,
wherein a work function φmd of the first electrode, electron affinity χ of the oxide semiconductor layer, and a work function φms of the second electrode satisfy φms ≦χ<φmd.

10. The non-linear element according to claim 9, wherein a material of the first electrode is tungsten, molybdenum, chromium, iron, or indium tin oxide.

11. The non-linear element according to claim 9, wherein a material of the second electrode is titanium, yttrium, aluminum, magnesium, silver, or zirconium.

12. The non-linear element according to claim 9, wherein a difference between the work function φmd of the first electrode and the electron affinity χ of the oxide semiconductor layer is greater than or equal to 0.2 eV.

13. The non-linear element according to claim 9, wherein a carrier concentration of the oxide semiconductor layer is less than or equal to $5\times10^{14}$ /cm$^3$.

14. The non-linear element according to claim 9, wherein at least a region of the insulating film which is in contact with the oxide semiconductor layer is an oxide insulating film.

15. The non-linear element according to claim 14, wherein the oxide insulating film is a silicon oxide film which is covered by silicon nitride.

16. A display device comprising a protection circuit including the non-linear element according to claim 9.

17. An electronic device comprising the display device according to claim 16.

18. A non-linear element comprising:
a first electrode formed over a substrate;
an oxide semiconductor layer formed on and in contact with the first electrode, in which a hydrogen concentration is less than or equal to $5\times10^{19}$ /cm$^3$;
a second electrode formed on and in contact with the oxide semiconductor layer;
an insulating film covering the first electrode, the oxide semiconductor layer, and the second electrode; and
a plurality of third electrodes formed in contact with the insulating film,
wherein the plurality of third electrodes is adjacent to a side surface of the oxide semiconductor layer with the insulating film interposed therebetween,
wherein the plurality of third electrodes is electrically connected to the first electrode, and
wherein a work function φmd of the first electrode, electron affinity χ of the oxide semiconductor layer, and a work function φms of the second electrode satisfy φms ≦χ<φmd.

19. The non-linear element according to claim 18, wherein a material of the first electrode is tungsten, molybdenum, chromium, iron, or indium tin oxide.

20. The non-linear element according to claim 18, wherein a material of the second electrode is titanium, yttrium, aluminum, magnesium, silver, or zirconium.

21. The non-linear element according to claim 18, wherein a difference between the work function φmd of the first electrode and the electron affinity χ of the oxide semiconductor layer is greater than or equal to 0.2 eV.

22. The non-linear element according to claim 18, wherein a carrier concentration of the oxide semiconductor layer is less than or equal to $5\times10^{14}$ /cm$^3$.

23. The non-linear element according to claim 18, wherein at least a region of the insulating film which is in contact with the oxide semiconductor layer is an oxide insulating film.

24. The non-linear element according to claim 23, wherein the oxide insulating film is a silicon oxide film which is covered by silicon nitride.

25. A display device comprising a protection circuit including the non-linear element according to claim 18.

26. An electronic device comprising the display device according to claim 25.

27. A non-linear element comprising:
a first electrode formed over a substrate;
an oxide semiconductor layer formed on and in contact with the first electrode, in which a hydrogen concentration is less than or equal to $5\times10^{19}$ /cm$^3$;
a second electrode formed on and in contact with the oxide semiconductor layer;
an insulating film covering the first electrode, the oxide semiconductor layer, and the second electrode; and
a plurality of third electrodes formed in contact with the insulating film,
wherein the plurality of third electrodes is adjacent to a side surface of the oxide semiconductor layer with the insulating film interposed therebetween,
wherein the plurality of third electrodes is electrically connected to the second electrode, and
wherein a work function φmd of the first electrode, electron affinity χ of the oxide semiconductor layer, and a work function φms of the second electrode satisfy φms ≦χ<φmd.

28. The non-linear element according to claim 27, wherein a material of the first electrode is tungsten, molybdenum, chromium, iron, or indium tin oxide.

29. The non-linear element according to claim 27, wherein a material of the second electrode is titanium, yttrium, aluminum, magnesium, silver, or zirconium.

30. The non-linear element according to claim 27, wherein a difference between the work function $\phi md$ of the first electrode and the electron affinity $\chi$ of the oxide semiconductor layer is greater than or equal to 0.2 eV.

31. The non-linear element according to claim 27, wherein a carrier concentration of the oxide semiconductor layer is less than or equal to $5 \times 10^{14}$ /cm$^3$.

32. The non-linear element according to claim 27, wherein at least a region of the insulating film which is in contact with the oxide semiconductor layer is an oxide insulating film.

33. The non-linear element according to claim 32, wherein the oxide insulating film is a silicon oxide film which is covered by silicon nitride.

34. A display device comprising a protection circuit including the non-linear element according to claim 27.

35. An electronic device comprising the display device according to claim 34.

* * * * *